US008644066B2

(12) United States Patent
Park

(10) Patent No.: US 8,644,066 B2
(45) Date of Patent: Feb. 4, 2014

(54) MULTI-LEVEL NON-VOLATILE MEMORY DEVICE, SYSTEM AND METHOD WITH STATE-CONVERTED DATA

(75) Inventor: Ki Tae Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 842 days.

(21) Appl. No.: 12/620,907

(22) Filed: Nov. 18, 2009

(65) Prior Publication Data

US 2010/0125701 A1 May 20, 2010

(30) Foreign Application Priority Data

Nov. 18, 2008 (KR) .................. 10-2008-0114808

(51) Int. Cl.
*G11C 11/34* (2006.01)
*G11C 16/04* (2006.01)

(52) U.S. Cl.
USPC ...................................... 365/185.03; 365/236

(58) Field of Classification Search
USPC ........................................... 365/185.03, 236
See application file for complete search history.

(56) References Cited

U.S. PATENT DOCUMENTS

| | | | | |
|---|---|---|---|---|
| 5,907,855 A * | 5/1999 | Norman | .................. | 711/103 |
| 6,728,825 B1 * | 4/2004 | Norman | .................. | 711/103 |
| 7,221,592 B2 * | 5/2007 | Nazarian | .................. | 365/185.19 |
| 7,457,155 B2 * | 11/2008 | Nazarian | .................. | 365/185.02 |
| 7,855,913 B2 * | 12/2010 | Fernandes | .................. | 365/185.03 |
| 8,345,476 B2 * | 1/2013 | Chou et al. | .................. | 365/185.03 |
| 2006/0002180 A1 * | 1/2006 | Frey | .................. | 365/158 |
| 2008/0090604 A1 * | 4/2008 | Dover | .................. | 455/550.1 |

FOREIGN PATENT DOCUMENTS

| | | |
|---|---|---|
| JP | 2001-093288 | 4/2001 |
| KR | 1020060041287 A | 5/2006 |
| KR | 1020080022394 A | 3/2008 |

* cited by examiner

*Primary Examiner* — Harry W Byrne
*Assistant Examiner* — Lance Reidlinger
(74) *Attorney, Agent, or Firm* — Myers Bigel Sibley & Sajovec PA

(57) ABSTRACT

Methods of programming nonvolatile memory devices include programming a plurality of nonvolatile multi-state memory cells in the non-volatile memory device with state-converted data derived from non-state-converted data. This state-converted data may be associated with a greater number of erased states relative to the non-state-converted data, when programmed into the plurality of nonvolatile memory cells. The methods also include generating a flag having a value that indicates which ones of the plurality of nonvolatile memory cells have been programmed with data that is swapped with data in other ones of the plurality of nonvolatile memory cells. This flag may also be programmed into the nonvolatile memory device. Operations may also be performed to read the state-converted data (and flag) from the plurality of nonvolatile memory cells and then decode the state-converted data into the non-state-converted data, based on the value of the flag.

18 Claims, 21 Drawing Sheets

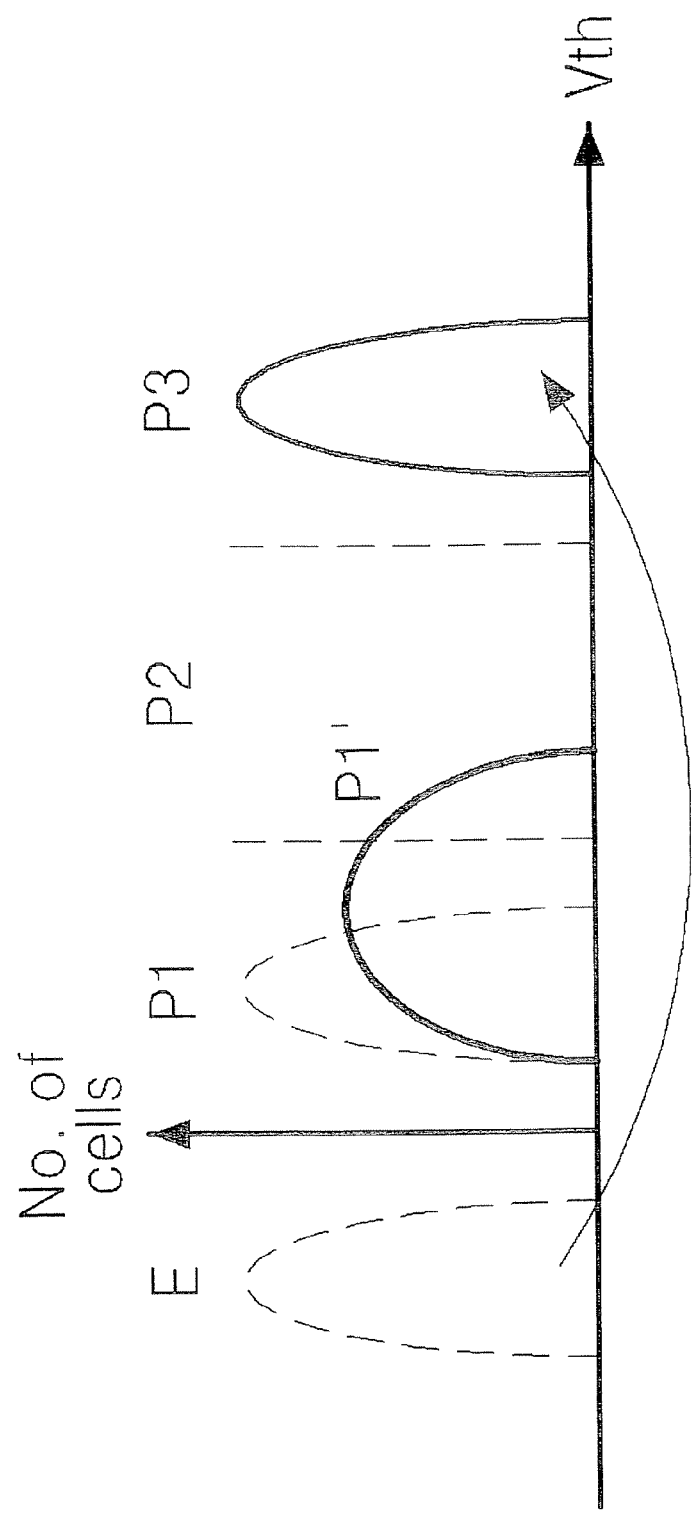

FIG. 9

| Order | | E '11' | P1 '01' | P2 '00' | P3 '10' | Decision | Example |
|---|---|---|---|---|---|---|---|
| 1 | P3 '10' | P3E = (#P3) − (#E) | P3P1 = (#P3) − (#P1) | P3P2 = (#P3) − (#P2) | — | If Max.(P3X) > 0, SWAP Max.(P3X) | If P3E > P3P1 & P3P2, P3 ↔ E |
| 2 | P2 '01' | P2E = (#P2) − (#E) | P2P1 = (#P2) − (#P1) | | — | If Max.(P2X) > 0, SWAP Max.(P2X), EXCEPT STATE SWAPPED FOR P3 | If P2P1 > 0, P2 ↔ P1 |
| 3 | P1 '00' | P1E = (#P1) − (#E) | | | — | If Max.(P1X) > 0, SWAP Max.(P1X), EXCEPT STATE SWAPPED FOR P3 OR P2 | SINCE P1 AND E HAVE BEEN SWAPPED FOR P2 AND P3, SKIP SWAPPING |

FIG. 10

| Flag Data | E | P1 | P2 | P3 |
|---|---|---|---|---|
| P3 | 001 | 010 | 011 | 000 |
| P2 | 100 | 101 | 000 | — |
| P1 | 110 | 000 | — | — |
| E | 000 | — | — | — |

MULTI-LEVEL NON-VOLATILE MEMORY DEVICE, SYSTEM AND METHOD WITH STATE-CONVERTED DATA

REFERENCE TO PRIORITY APPLICATION

This application claims priority to Korean Patent Application No. 10-2008-0114808 filed Nov. 18, 2008, the contents of which are hereby incorporated herein by reference.

FIELD OF THE INVENTION

The present invention relates to semiconductor memory devices and, more particularly, to methods of programming multi-level non-volatile memory devices.

BACKGROUND

Semiconductor memory devices include volatile semiconductor memory devices and non-volatile semiconductor memory devices. A volatile semiconductor memory device typically has fast read and write speeds, but drawbacks in that stored content is lost when external power supply is discontinued. In contrast, a non-volatile semiconductor memory device, which may have read and write speeds that are relatively slow, the stored content may be kept even when the external power supply is discontinued. Thus, to store data to be stored regardless of the continuation of power supply, the non-volatile semiconductor memory device is used.

Nonvolatile semiconductor memory devices include phase-change random access memory (PRAM), mask read-only memory (MROM), programmable read-only memory (PROM), erasable programmable read-only memory (EPROM), and electrically erasable programmable read-only memory (EEPROM), etc. With respect to MROM, PROM, and EPROM among these nonvolatile semiconductor memory devices, it is not easy for normal users to renew stored information since erase and write operations cannot be freely performed. On the other hand. EEPROM enables electrical erase and write operations and is thus increasingly used for system programming needing continuous update or used as auxiliary memory devices. Particularly, flash EEPROM (hereinafter, referred to as a flash memory device) has a higher degree of integration than existing EEPROM and is thus very advantageous when it is used as a large-capacity auxiliary memory device. Accordingly, the flash memory device is widely used in small electronic devices. For example, flash memory devices may be used in digital cameras, digital camcorders, digital music players.

A flash memory device determines whether electrons are injected into a floating gate using a Fowler-Nordheim (F-N) tunneling mechanism and stores data at a first logic level or a second logic level according to a result of the determination. Recently, studies on multi-level memory for storing multi-bit data in a single memory cell have been actively carried on in order to increase the density of integration for memory. A memory cell in the multi-level memory is capable of storing multiple bits. Such memory cell storing multiple bits is referred to as a multi-level cell (MLC) while a memory cell storing a single bit is referred to as a single-level cell (SLC). Since the multi-level cell stores at least two bits, it has at least three data storage states (or cell states or states) and at least three threshold voltage distributions respectively corresponding to the states.

The threshold voltage distribution of a multi-level cell can change over time due to coupling with an adjacent cell, charge loss, and so on. The variation of a cell distribution is related with a cell state. For instance, a cell state having a high threshold voltage induces more charge loss than a cell state having a low threshold voltage and a coupling effect increases when an adjacent cell having a state corresponding to a low threshold voltage distribution is programmed to a state corresponding to a high threshold voltage distribution.

SUMMARY

Methods of programming nonvolatile memory devices according to some embodiments of the invention include programming a plurality of nonvolatile multi-state memory cells in the non-volatile memory device with state-converted data derived from non-state-converted data. This state-converted data may be associated with a greater number of erased states relative to the non-state-converted data, when programmed into the plurality of nonvolatile memory cells. The methods also include generating a flag having a value that indicates which ones of the plurality of nonvolatile memory cells have been programmed with data that is swapped with data in other ones of the plurality of nonvolatile memory cells. This flag may also be programmed into the nonvolatile memory device. Operations may also be performed to read the state-converted data (and flag) from the plurality of non-volatile memory cells and then decode the state-converted data into the non-state-converted data, based on the value of the flag.

According to still further embodiments of the present invention, the plurality of nonvolatile memory cells are m-bit memory cells configured to support $2^m$ distinct threshold voltage states per cell. In some of these embodiments of the invention, the programming operation includes encoding the non-state-converted data into state-converted data using an encoding algorithm. This encoding algorithm is configured to reduce a number of the plurality of nonvolatile memory cells programmed with a maximum of the $2^m$ distinct threshold voltage states when the plurality of nonvolatile memory cells are programmed with state-converted data relative to when the plurality of nonvolatile memory cells are programmed with non-state-converted data.

According to some additional embodiments of the present inventive concept, there is provided a method of operating a non-volatile memory device including a plurality of multi-level memory cells. The method includes counting the number of multi-level memory cells in each of a plurality of states with respect to a data set and generating each state count; generating a state-converted data set by swapping at least one state among the plurality of states for one state among the rest of the states according to state counts for the respective states and a predetermined state conversion rule; generating state conversion flag data indicating information about the swapped states; and programming the state-converted data set to cells selected from among the plurality of multi-level memory cells.

The method may further include receiving the data set from a host. Also, the method may further include reading the state-converted data set from the cells selected from among the plurality of multi-level memory cells; recovering the data set from the state-converted data set by re-swapping the states that have been swapped before according to the state conversion flag data; and transmitting the recovered data set to the host.

According to other embodiments of the present inventive concept, there is provided a non-volatile memory device including a memory cell array including a plurality of non-volatile multi-level memory cells; a data conversion control block configured to count the number of multi-level memory cells in each of a plurality of states with respect to a multi-level data set to generate each state count, generate a state-converted data set by swapping at least one state among the plurality of states for one state among the rest of the states according to state counts for the respective states and a predetermined state conversion rule, and generate state conversion flag data indicating information about the swapped states; and a write driver/sense amplifier circuit configured to write the state-converted data set to cells selected from the memory cell array and read the state-converted data set from the selected cells.

The data conversion control block may recover the data set from the state-converted data set read by the write driver/sense amplifier circuit by re-swapping the states that have been swapped before according to the state conversion flag data.

The non-volatile memory device may further include an error correction code (ECC) engine configured to ECC-encode the state-converted data set or the data set before the state conversion and ECC-decode the data set recovered from the state-converted data set or the state-converted data set before the recovery.

According to further embodiments of the present inventive concept, there is provided a memory controller for controlling a non-volatile memory device including a plurality of non-volatile multi-level memory cells. The memory controller includes a data conversion control block configured to count the number of multi-level memory cells in each of a plurality of states with respect to a multi-level data set received from a host to generate each state count, generate a state-converted data set by swapping at least one state among the plurality of states for one state among the rest of the states according to state counts for the respective states and a predetermined state conversion rule, and generate state conversion flag data indicating information about the swapped states; and a central processing unit configured to control the non-volatile memory device to write the state-converted data set to the non-volatile memory device and to read the state-converted data set from the non-volatile memory device.

The data conversion control block may recover the data set from the state-converted data set read from the non-volatile memory device by re-swapping the states that have been swapped before according to the state conversion flag data.

The memory controller may further includes an error correction code (ECC) engine configured to ECC-encode the state-converted data set or the data set before the state conversion and ECC-decode the data set recovered from the state-converted data set or the state-converted data set which has been read from the non-volatile memory device.

According to further embodiments of the present inventive concept, there is provided an electronic system. The electronic system includes a central processing unit (CPU) configured to control overall operations of the electronic system; and a non-volatile memory device configured to include a plurality of multi-level memory cells and store a data set processed or to be processed by the CPU, the non-volatile memory device further configured to store a state-converted data set by swapping at least one state among a plurality of states for one state among the rest of the states. The plurality of states are states of multi-level data constituting the data set.

BRIEF DESCRIPTION OF THE DRAWINGS

FIG. 9 is a rule table according to some embodiments of the present inventive concept;

FIG. 10 is a table showing state conversion flag data according to some embodiments of the present inventive concept;

FIG. 17 is a block diagram of an electronic system according to an exemplary embodiment of the present inventive concept.

DETAILED DESCRIPTION OF THE EMBODIMENTS

Figure 1:
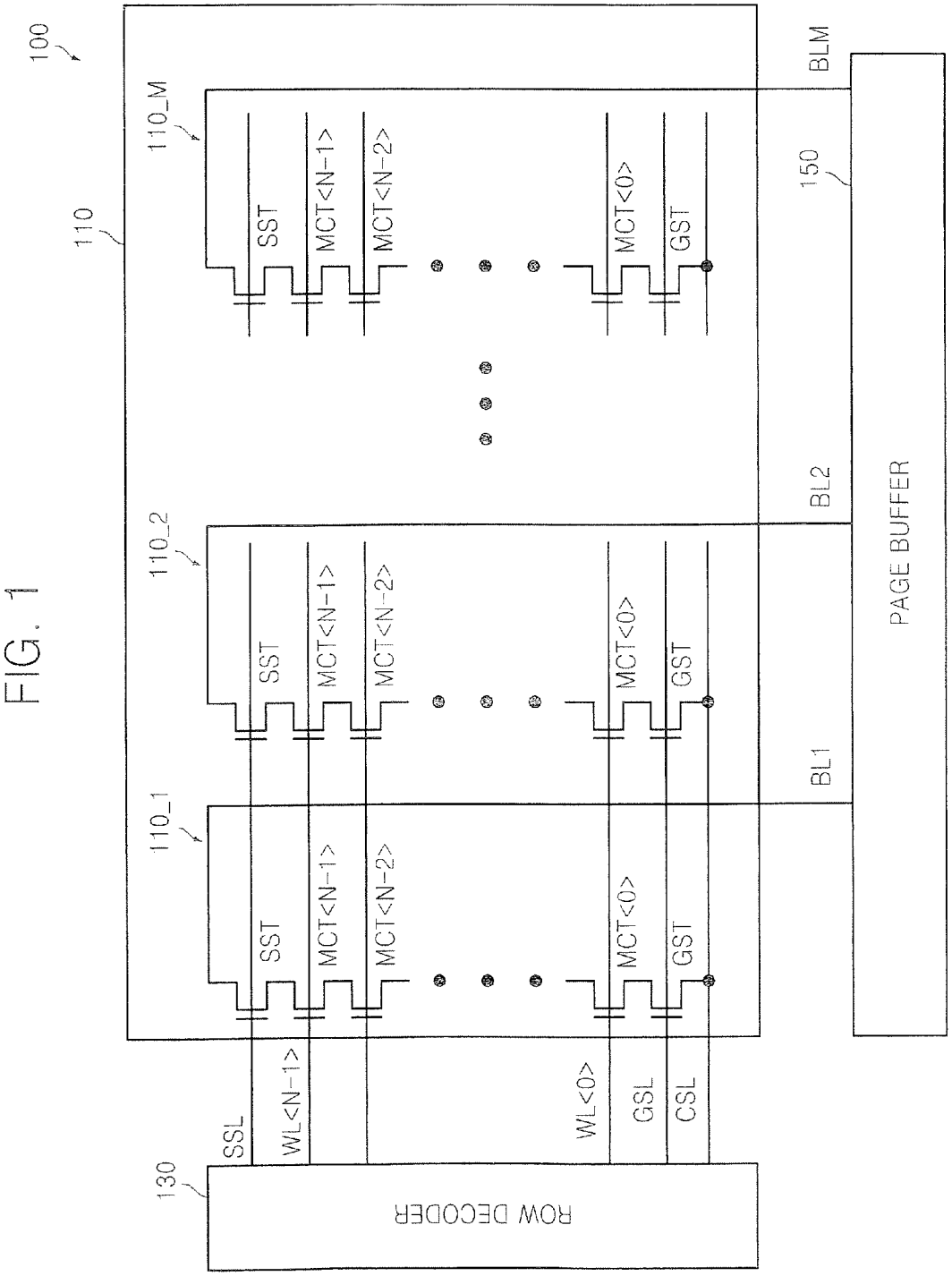
FIG. 1 is a block diagram of a non-volatile memory device according to some embodiments of the present inventive concept.

The present inventive concept now will be described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a non-volatile memory device, and particularly of, a NAND flash memory device 100 according to some embodiments of the present inventive concept. The NAND flash memory device 100 includes a memory cell array 110, a row decoder 130, and a page buffer circuit 150.

The memory cell array 110 is divided into a plurality of memory blocks (not shown) each including a plurality of strings 110_1 through 110_M extending in a column direction. For clarity of the description, only a single memory block is illustrated in FIG. 1. Each of the strings 110_1 through 110_M includes a string selection transistor SST, a ground selection transistor GST, and a plurality of memory cell transistors MCT<0> through MCT<N−1> connected in series between the string selection transistor SST and the ground selection transistor GST. A gate of the string selection transistor SST is connected to a string selection line SSL and a drain thereof is connected to a corresponding bit line among a plurality of bit lines BL1 through BLM. A gate of the ground selection transistor GST is connected to a ground selection line GSL and a source thereof is connected to a common source line CSL. Control gates of the respective memory cell transistors MCT<0> through MCT<N−1> are respectively connected to word lines WL<0> through WL<N−1>.

The voltage level of the lines SSL, WL<0> through WL<N−1>, and GSL is controlled by the row decoder 130 in response to a predetermined timing control signal (not shown) and the voltage level of each of the bit lines BL1 through BLM is controlled by a page buffer (not shown) included in the page buffer circuit 150. Here, an operation of controlling the lines SSL, WL<0> through WL<N−1>, and GSL and an operation of controlling the bit lines BL1 through BLM are obvious to those of ordinary skill in the art, and a detailed description thereof will be thus omitted. Each of the memory cell transistors MCT<0> through MCT<N−1> in the memory cell array 110 is a multi-level cell storing data of multiple bits, i.e., at least two bits.

Figure 2:
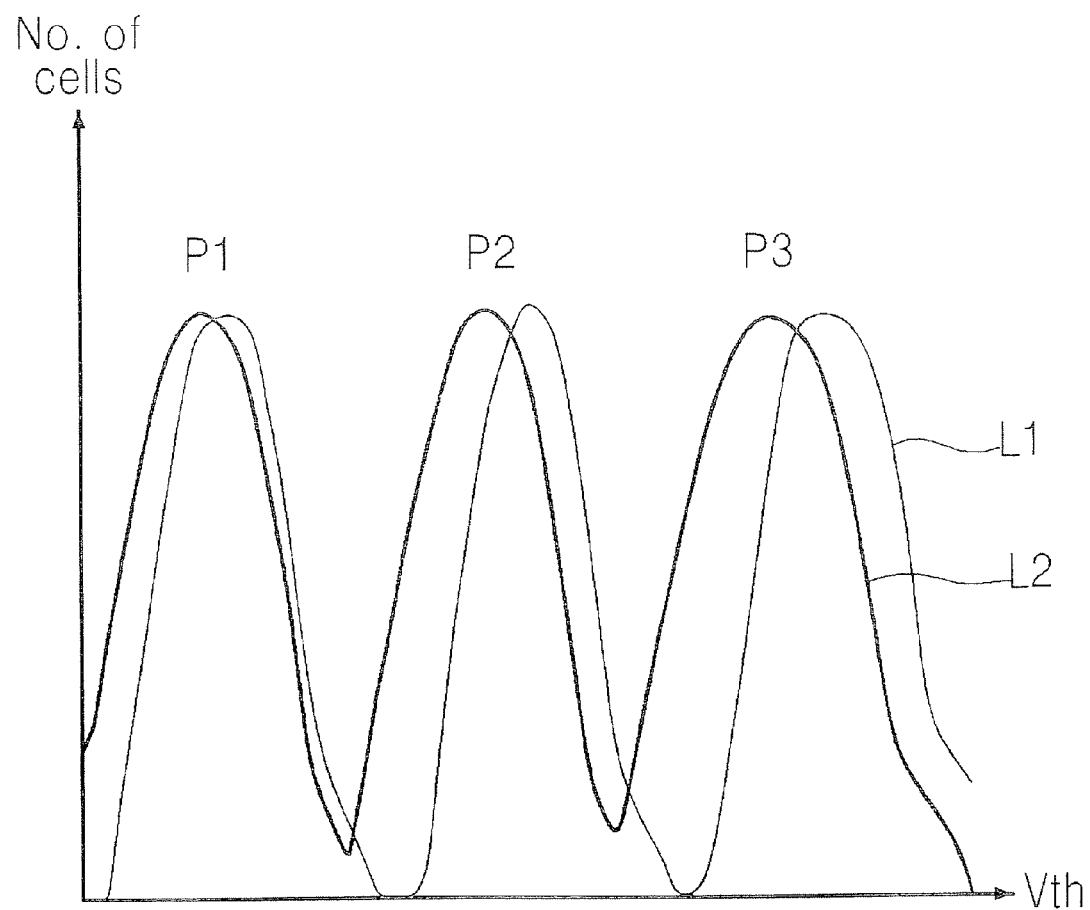
FIG. 2 is a graph showing a cell distribution, i.e., a threshold voltage distribution of 2-bit memory cells per state.

FIG. 2 is a graph showing a cell distribution, i.e., a threshold voltage distribution of 2-bit memory cells per state. In the graph illustrated in FIG. 2, the x-axis is a threshold voltage Vth and the y-axis is the number of cells of a state. The 2-bit memory cells may have an erased state (not shown) and first through third programmed states P1 through P3.

In FIG. 2, a curve L1 indicates an initial cell distribution and a curve L2 indicates a cell distribution after time lapses. It can be inferred from the graph illustrated in FIG. 2 that the cell distribution shifts toward lower threshold voltages Vth over time due to charge loss. In particular, a cell state having a high threshold voltage Vth induces more charge loss than a cell state having a low threshold voltage Vth, and therefore, the higher the threshold voltage Vth, the greater the amount of shift.

Figure 3A:
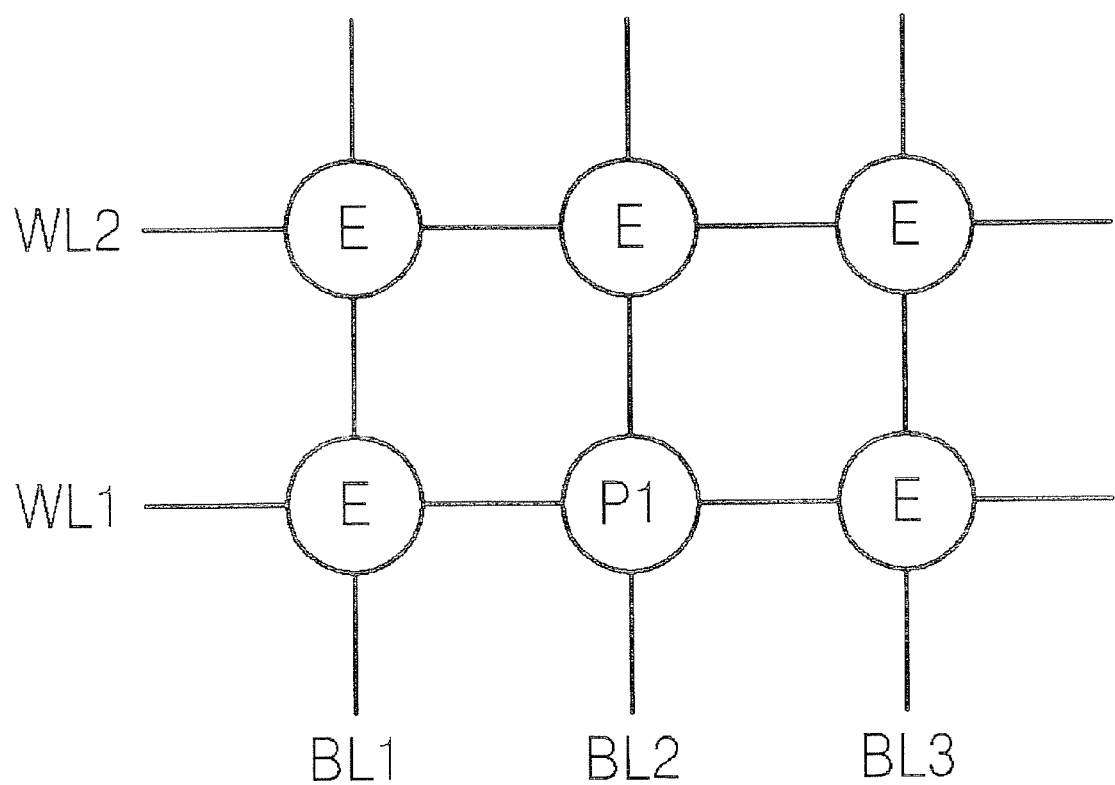
FIGS. 3A through 4B are diagrams for explaining a coupling effect caused by programming of an adjacent cell.
Figure 3B:
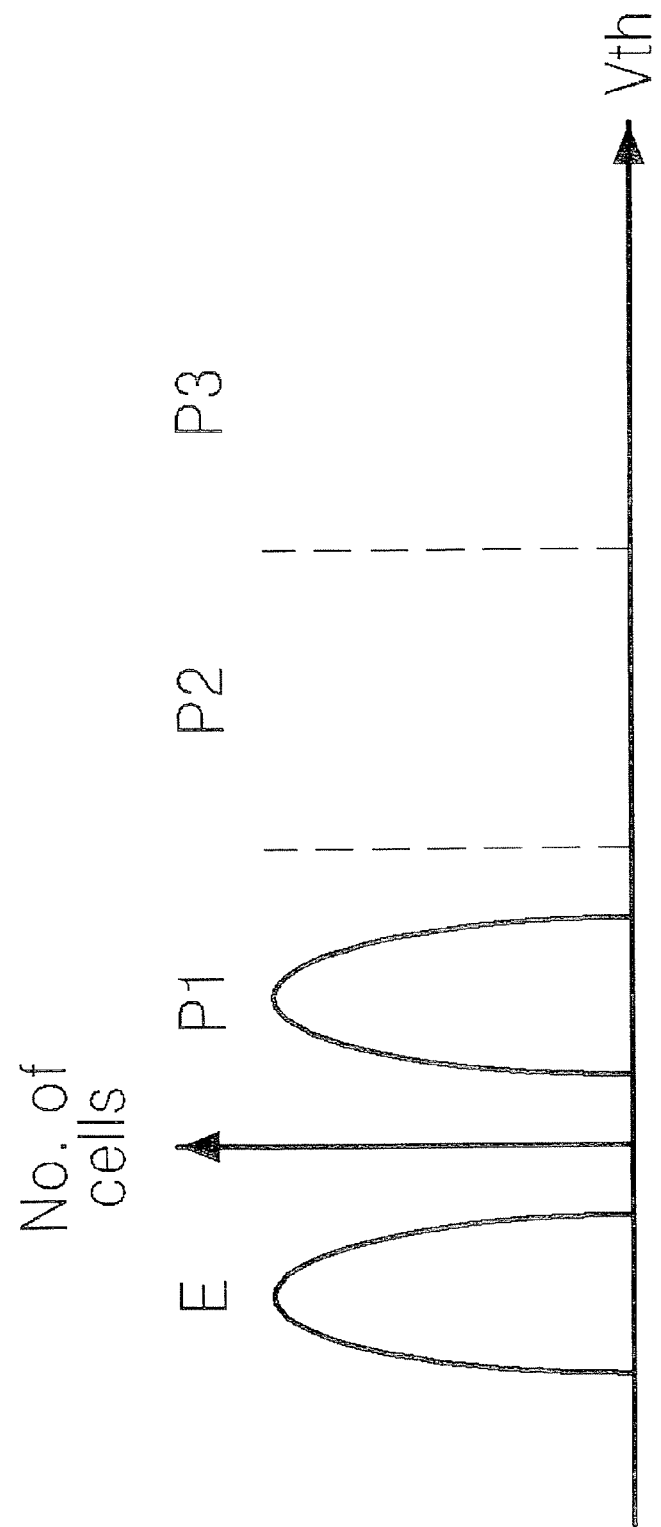

FIGS. 3A through 4B are diagrams for explaining a coupling effect caused by programming of an adjacent cell. FIG. 3A shows a case where a cell (hereinafter, referred to as a reference cell) at the intersection between the word line WL1 and the bit line BL2 has the first programmed state P1 and its adjacent cells, i.e., cells at the intersections among the word line WL1 and the bit lines BL1 and BL3 and cells at the intersections among the word line WL2 and the bit lines BL1 through BL3 have an erased state E. FIG. 3B shows a cell distribution corresponding to the case illustrated in FIG. 3A.

Figure 4A:
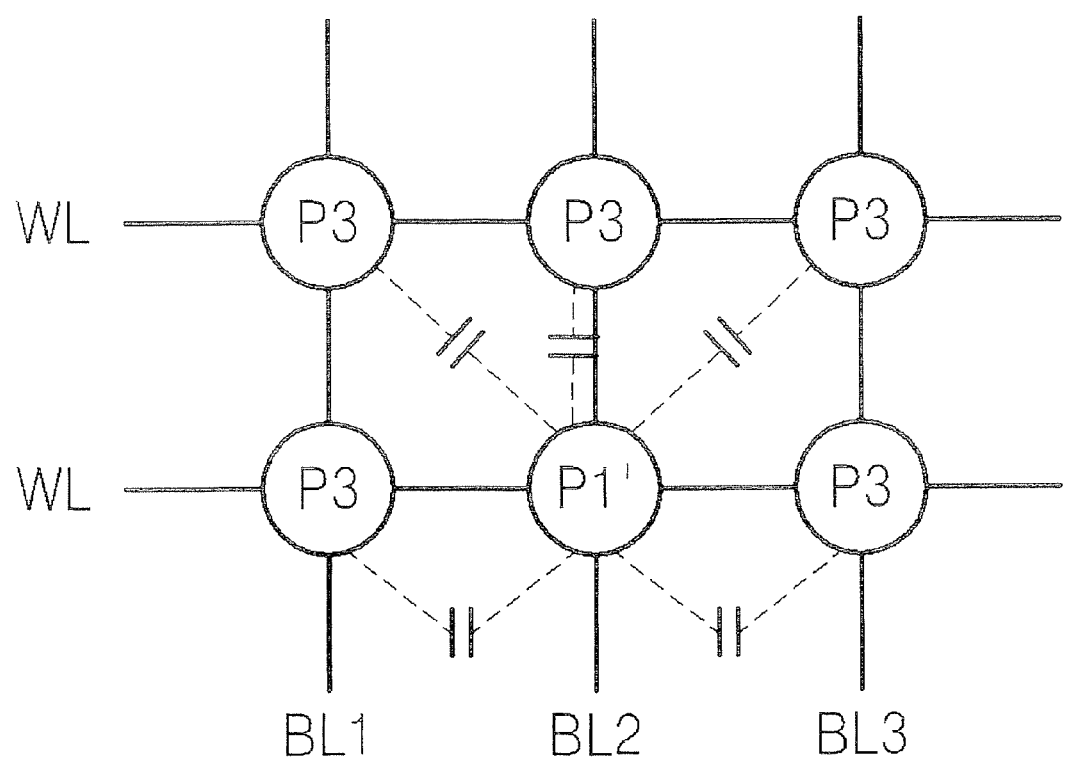

An assumption is made that the cells in the case illustrated in FIG. 3A are programmed as illustrated in FIG. 4A. In other words, let's assume that the adjacent cells to the reference cell having the first programmed state P1 are programmed to the third programmed state P3. Capacitors illustrated in FIG. 4A are modeled capacitors to show the coupling effect between the reference cell and the adjacent cells.

When the adjacent cells to the reference cell are programmed to the third programmed state P3, as illustrated in FIG. 4A, a cell distribution may be represented by the graph illustrated in FIG. 4B. Referring to FIG. 4B, when the adjacent cells are programmed from the erased state E to the third programmed state P3, the reference cell in the first programmed state P1 has a shifted distribution P1' due to the coupling effect. In other words, a threshold voltage distribution shifts from "P1" to "P1'" due to coupling disturb.

As the threshold voltage Vth to which the adjacent cells are programmed increases, the coupling effect increases. Accordingly, the coupling effect and charge loss can be reduced by reducing the number of cells having the highest threshold voltage, and therefore, the reliability of a non-volatile memory device can be increased.

Figure 5:
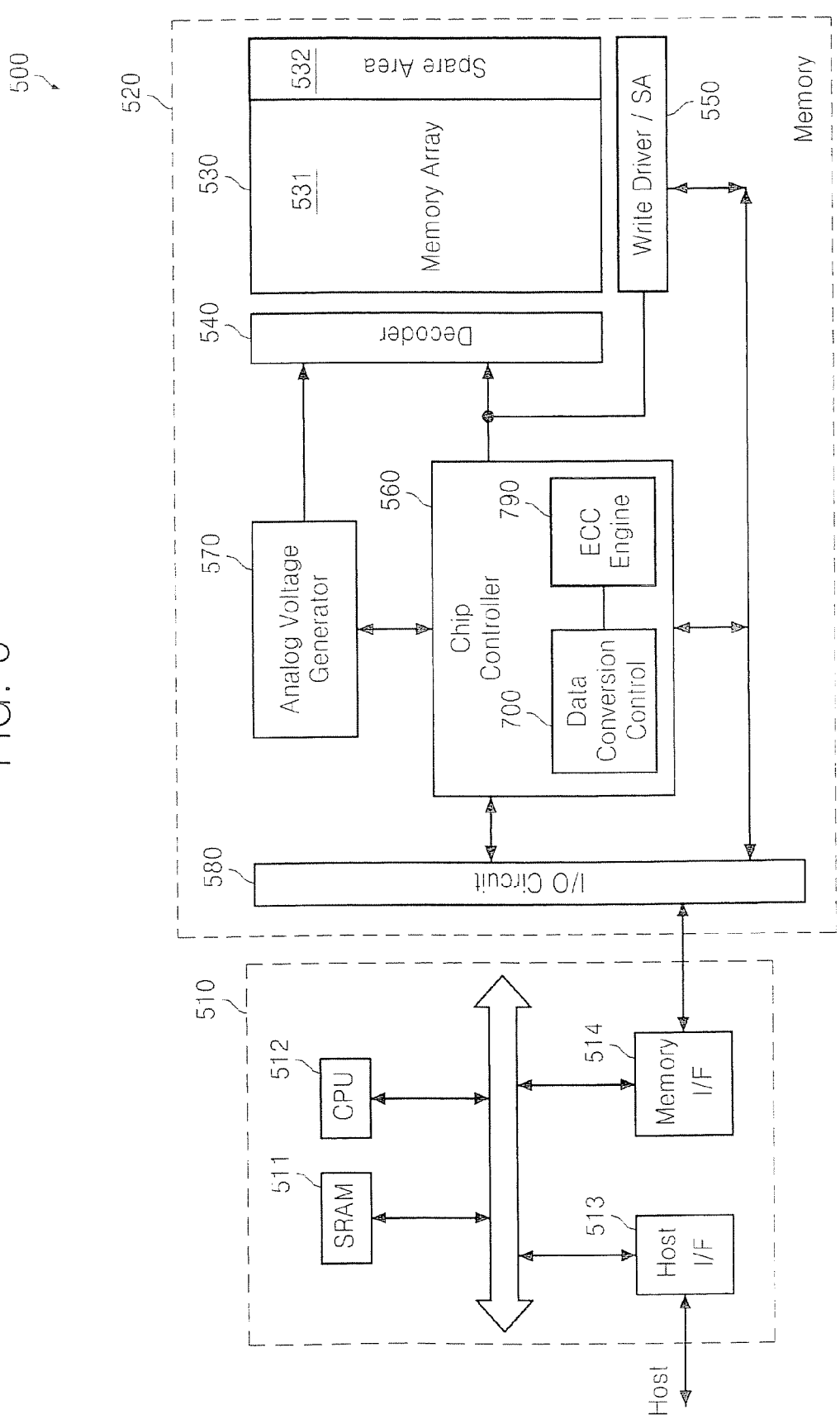
FIG. 5 is a block diagram of a non-volatile memory system according to some embodiments of the present inventive concept.

FIG. 5 is a block diagram of a non-volatile memory system 500 according to some embodiments of the present inventive concept. The non-volatile memory system 500 includes a non-volatile memory device 520 and a memory controller 510 controlling the non-volatile memory device 520.

The non-volatile memory device 520 includes a memory cell array 530, a decoder 540, a write driver/sense amplifier (SA) circuit 550, a chip controller 560, a voltage generator 570, and an input/output (I/O) circuit 580.

The memory cell array 530 includes a main area 531 and a spare area 532. The main area 531 is used to store user data and is thus referred to as a user data area. The spare area 532 is used to store error correction code (ECC) information and state conversion flag data which will be described later. The structure and the operations of the memory cell array 530 may be similar to those of the memory cell array 110 illustrated in FIG. 1.

The decoder 540 may select one from among a plurality of word lines in response to row addresses and supply a first operating voltage to the selected word line and a second operating voltage to non-selected word lines. For instance, in a programming mode, the decoder 540 may supply the first operating voltage, e.g., a program voltage, to the selected word line and the second operating voltage, e.g., a pass voltage, to the non-selected word lines. The program voltage may be 15 to 20 V and the pass voltage may be 10 V. In a reading mode, the decoder 540 may supply the first operating voltage, e.g., a ground voltage, to the selected word line and the second operating voltage, e.g., a read voltage, to the non-selected word lines. The read voltage may be 4.5 V. The program voltage is higher than the pass voltage. The pass voltage is higher than the read voltage.

The write driver/SA circuit 550 is selectively connected with a plurality of bit lines and writes (or programs) data to selected memory cells or senses and amplifies data from the selected memory cells to read the data. The write driver/SA circuit 550 may include a plurality of data storage units (not shown) for storing a data set to be programmed in the programming mode and for storing a data set read from memory cells in the reading mode. Each of the data storage units may be implemented using a plurality of latches. The data storage units may also store a data set read from memory cells in a program verify mode.

A switching block (not shown) may also be provided between the write driver/SA circuit 550 and the memory cell array 530 to selectively connect a write driver or an SA to the bit lines.

The voltage generator 570 generates voltages, e.g., the program voltage, the pass voltage, and the read voltage, necessary for the operations of the non-volatile memory device 520.

The chip controller 560 outputs internal control signals (not shown) for controlling the operations (e.g., a program operation, an erase operation, and a read operation) of the non-volatile memory device 520 in response to external commands. The chip controller 560 includes a data conversion control block 700 and an ECC engine 790.

Figure 7:
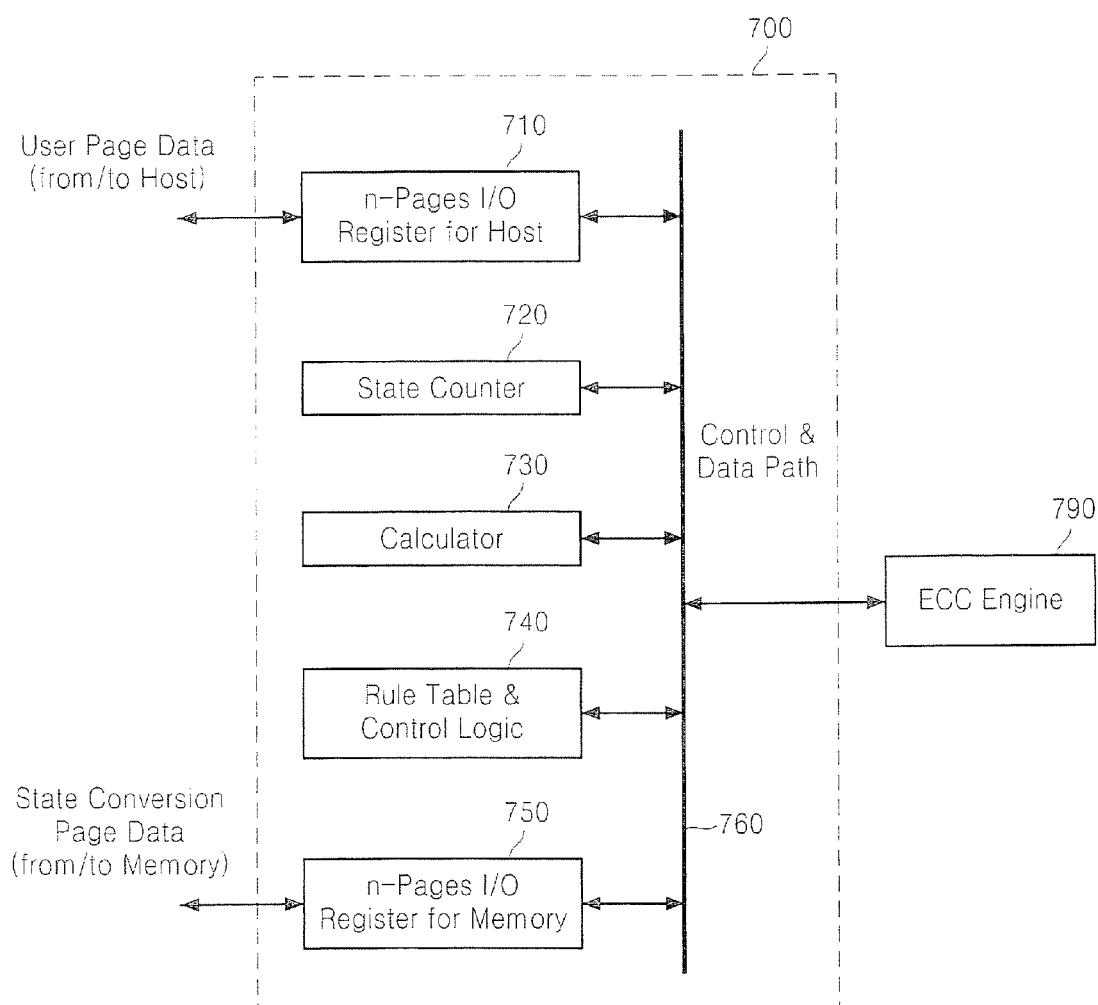
FIG. 7 is a functional block diagram of a data conversion control block according to some embodiments of the present inventive concept.

FIG. 7 is a functional block diagram of the data conversion control block 700 according to some embodiments of the present inventive concept. Referring to FIG. 7, the data conversion control block 700 includes a first data storage unit 710, a second data storage unit 750, a state counter 720, a calculator 730, a rule table and control unit 740, and a control and data path 760.

The first data storage unit 710 stores a data set, e.g., multi-page data, which is received from a host or will be transmitted to the host. The second data storage unit 750 stores a data set, e.g., multi-page data, which is read from memory or will be programmed to the memory. The first and second data storage units 710 and 750 each may be implemented by a register that can store multi-page data. The state counter 720 counts the number of cells in each state in units of predetermined groups (e.g., sectors) in the data set stored in the first data storage unit 710. A result of counting the number of cells (or data) in each state may be referred to as a "state count".

Figure 8:
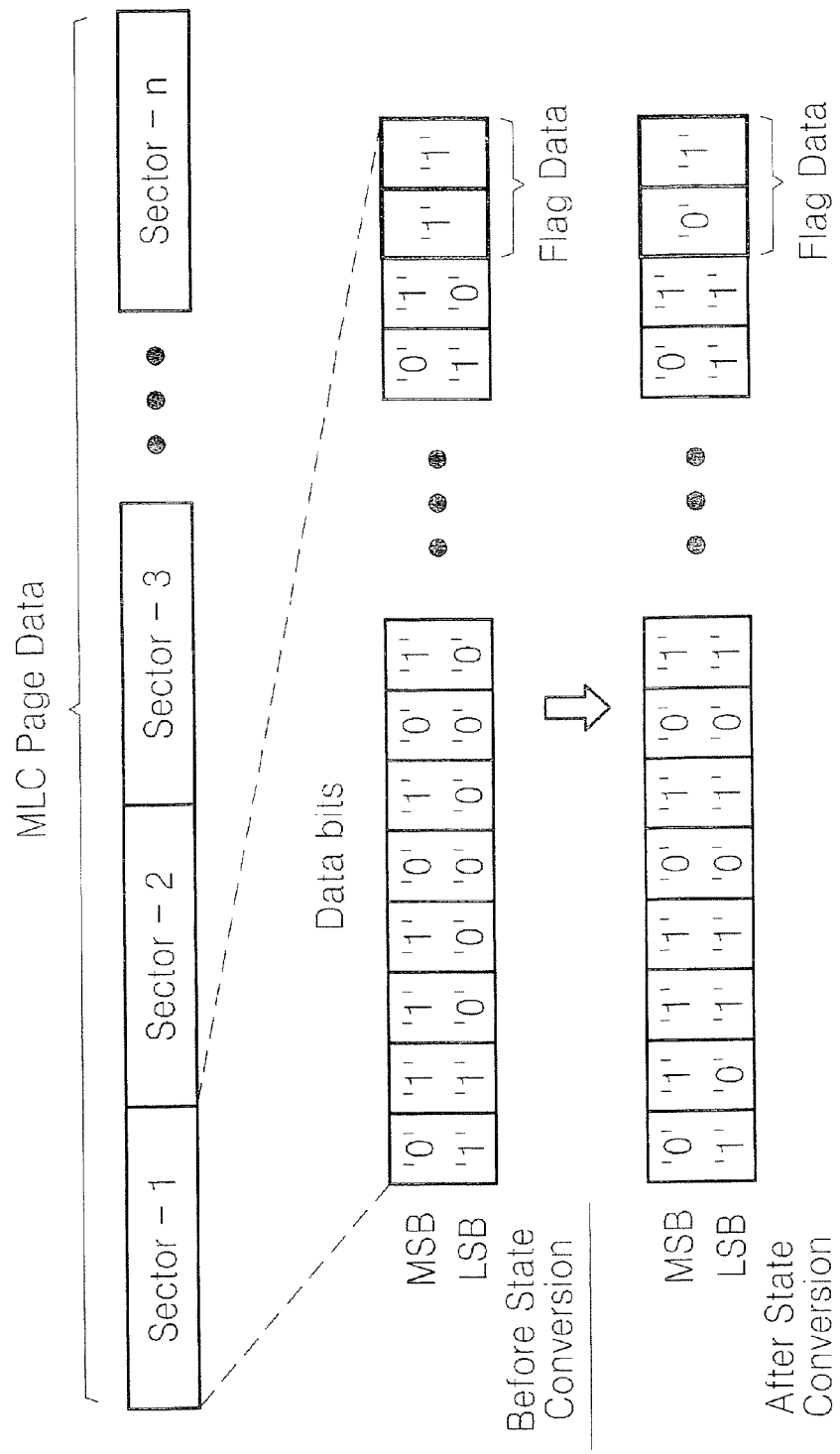
FIG. 8 is a diagram showing page data and sector data.

FIG. 8 is a diagram showing page data and sector data. A single multi-level cell (MLC) page may be a data set that has been stored or will be stored in a plurality of MLCs (with a capacity of, for example, 2 or 4 Kbytes) connected to one word line. In the current embodiments of the present inventive concept, each MLC is a 2-bit memory cell, and therefore, the MLC page includes a least significant bit (LSB) page and a most significant bit (MSB) page. A sector is a unit defined when the MLC page is divided by "n" which is 1 or an integer greater than 1, as illustrated in FIG. 8. For instance, when the MLC page is 4 Kbytes in size and each sector is 512 bytes in size, the MLC page includes 8 sectors, that is, n=8.

Each memory cell is determined to have one of four states according to whether each of the LSB and the MSB that have been stored or will be stored in the memory cell is "0" or "1". Accordingly, a "state" or a "cell state" indicates a combination of values of at least two bits that can be stored in a single MLC. Thus, "state count" may also indicate the number of each combination of values of at least two bits that can be stored in a single MLC.

In the embodiments of the present inventive concept, when the combination of the MSB and the LSB is "11", it is referred to as an erased state or "E". When the combination is "01", it is referred to as a first programmed state or "P1". When the combination is "00", it is referred to as a second programmed state or "P2". When the combination is "10", it is referred to as a third programmed state or "P3". However, the present inventive concept is not restricted to these embodiments, and the definition of the states according to the combinations of the MSB and the LSB may be different.

The state counter 720 counts the number of cells in each of the four states "11", "01", "00", and "10" with respect to each of sectors Sector-1 through Sector-n. As a result of counting with respect to the first sector Sector-1, a state count for "E" or "11" may be "i" (which is 0 or an integer greater than 0), a state count for "P1" or "01" may be (which is 0 or an integer greater than 0), a state count for "P2" or "00" may be (which is 0 or an integer greater than 0), and a state count for "P3" or "10" may be "q" (which is 0 or an integer greater than 0). At this time, "i+m+p+q" is the same as the total number of cells in the first sector Sector-1.

The rule table and control unit 740 stores a rule table. The rule table includes decision rules and a decision order which are predetermined for state conversion. The rule table and control unit 740 determines whether to convert states according to the rule table and performs state conversion according to a result of the determination.

The calculator 730 is controlled by the rule table and control unit 740 to perform calculations necessary for determining whether states are converted. For instance, the calculator 730 may calculate a difference between state counts and a maximum value and compare state counts with one another. In the current embodiments of the present inventive concept, the calculator 730 may compare state counts received from the state counter 720. A result of comparing the state counts may be "i<m<p<q".

FIG. 9 is a rule table according to some embodiments of the present inventive concept. Referring to FIG. 9, the rule table includes a decision order and decision rules.

At the first stage in the decision order, whether to convert the P3 state is determined. For this operation, P3X is calculated where P3X is a result of subtracting a state count for each of other states (e.g., states having a lower threshold voltage than the state P3) than the P3 state from a state count for the P3 state (hereinafter, referred to as the P3 state count #P3). For instance, P3X may be a result of subtracting a state count for the E state (hereinafter, referred to as an E state count #E), a state count for the P1 state (hereinafter, referred to as a P1 state count #P1), or a state count for the P2 state (hereinafter, referred to as a P2 state count #P2) from the P3 state count #P3. In other words, #P3−#E=P3E, #P3−#P1=P3P1, and #P3−#P2=P3P2 are calculated and a maximum value Max.(P3X) among the calculated P3Xs is obtained. When Max.(P3X) is greater than 0, the rule table and control unit 740 determines to swap two states related with Max.(P3X). For example, when P3E is Max.(P3X) since it is greater than P3P1 and P3P2 and when P3E is greater than 0, the rule table and control unit 740 determines to swap two states, i.e., the P3 state and the E state related with the P3E corresponding to Max.(P3X).

At the second stage, whether to convert the P2 state is determined. For this operation. P2X is calculated where P2X is a result of subtracting a state count for each of other states (e.g., states having a lower threshold voltage than the state P2) than the P2 state from the P2 state count #P2. For instance, P2X may be a result of subtracting the E state count #E or the P1 state count #P1 from the P2 state count #P2. In other words, #P2−#E=P2E and #P2−#P1=P2P1 are calculated and a maximum value Max.(P2X) among the calculated P2Xs is obtained. When Max.(P2X) is greater than 0, the rule table and control unit 740 determines to swap two states related with Max.(P2X). However, if either of the two states related with Max.(P2X) has been swapped for the P3 state at the first stage, the state swapped for the P3 state is ignored. For instance, if the E state has been swapped for the P3 state at the first stage, the E state is ignored or excluded from the decision-making on swapping of the P2 state in the second stage. Accordingly, in the second stage, P2E is ignored, and P2P1 is Max.(P2X). Therefore, when P2P1 is greater than 0, the rule table and control unit 740 determines to swap two states, i.e., the P2 state and the P1 state related with P2P1.

At the third stage in the decision order, whether to convert the P1 state is determined. For this operation, P1X is calculated where P1X is a result of subtracting a state count for each of other states (e.g., states having a lower threshold voltage than the state P1) than the P1 state from the P1 state count #P1. For instance, P1X may be a result of subtracting the E state count #E from the P1 state count #P1. In other words, #P1−#E=P1E is calculated When P1E is greater than 0, the rule table and control unit 740 determines to swap two states, i.e., the P1 state and the E state related with P1E. However, if either of the two states related with P1E has been swapped for the P2 or P2 state at the first or second stage, the state swapped for the P3 or P2 state is ignored. For instance, even when P1E is greater than 0, if it is determined that the P3 state is swapped for the state E at the first stage and the P2 state is swapped for the P1 state at the second stage, the P1 state and the E state are not swapped.

FIG. 10 is a table showing state conversion flag data according to some embodiments of the present inventive concept. Referring to FIG. 10, the state conversion flag data is information about converted states, e.g., information about what state has been swapped for what another state. For instance, the state conversion flag data may be set to "001" when the E state and the P3 state have been swapped, to "010" when the P1 state and the P3 state have been swapped, to "011 when the P2 state and the P3 state have been swapped, and to "000" when there no state swapping has occurred. The state conversion flag data may be generated per a predetermined data group, e.g., a sector.

In the present inventive concept, the state conversion rules are not restricted to the rule table illustrated in FIG. 9 and may be modified in various ways. For instance, the state conversion rules do not necessarily contain all of the decision rules show in FIG. 9 and may contain only some of the decision rules and may have a different decision order. For example, decision may be made only on the swap of the P3 state. According to the rule table illustrated in FIG. 9, a state that has been swapped at one stage in the decision order is excluded from a decision made at a later stage in the decision order. However, according to other embodiments of the present inventive concept, the state that has been swapped may also be subjected to the later decision. In this case, a state that has been swapped at the first stage may be swapped for another state again at the second stage. At this time, the state conversion flag data may include first flag data indicating state conversion at the first stage and second flag data indicating state conversion at the second stage. According to further embodiments of the present inventive concept, states may be converted using a predetermined mapping scheme according to the number of states. For instance, state conversion may be performed such that state counts decrease in the order of E, P1, P2, and P3 states or that a P3 state count is least and an E state count is secondly least since reliability statistically increases when the P3 state count is least.

Referring back to FIG. 5, the ECC engine 790 performs ECC encoding of a data set to be stored in the memory cell array 530 and performs ECC decoding of a data set read from the memory cell array 530. For this operation, the ECC engine 790 may include an ECC encoder (not shown) and an ECC decoder (not shown). The ECC encoder ECC-encodes a user data set received from the host and generates an encoded user data set and ECC information (which may be referred to ECC parity data or syndrome data). The ECC information may be stored in the spare area 532 of the memory cell array 530. The ECC decoder ECC-decodes the data set read from the memory cell array 530 based on the ECC information to detect an error position and corrects a bit having an error according to the error position.

The ECC engine 790 may perform ECC encoding of a data set that has been subjected to state conversion by the data conversion control block 700. In other words, when a data set is programmed, the data set may be processed by the data conversion control block 700 and then processed by the ECC engine 790. The processing order may be changed. That is, the data set may be processed by the ECC engine 790 first and then processed by the data conversion control block 700.

The I/O circuit 580 interfaces the non-volatile memory device 520 with an external device, e.g., the memory controller 510. In detail, the I/O circuit 580 may receive commands and data to be programmed from the external device and transmits a state signal and data read from the memory cell array 530 to the external device.

The memory controller 510 controls data communication between the host and the non-volatile memory device 520. For instance, the memory controller 510 controls the non-volatile memory device 520 to write or read data in compliance with the host.

The non-volatile memory system 500 illustrated in FIG. 5 may be a memory card.

The memory controller 510 includes a static random access memory (SRAM) 511, a central processing unit (CPU) 512, a host interface (I/F) 513, and a memory I/F 514. The SRAM 511 is used as an operating memory for the CPU 512. The host I/F 513 is equipped with a data communication protocol of the host connected with the memory card 500. The memory I/F 514 interfaces with the non-volatile memory device 520. The CPU 512 performs general control operations to write data to and/or read data from the non-volatile memory device 520. Although not shown, it would be apparent to those of ordinary skill in the art that the non-volatile memory system 500 may also include read-only memory which stores code data used for interface with the host.

In the non-volatile memory system 500 illustrated in FIG. 5 according to the current embodiments of the present inventive concept, the ECC engine 790 is included together with the data conversion control block 700 within the chip controller 560 of the non-volatile memory device 520. However, the ECC engine 790 may be included within the memory controller 510 in other embodiments of the present inventive concept.

Figure 6:
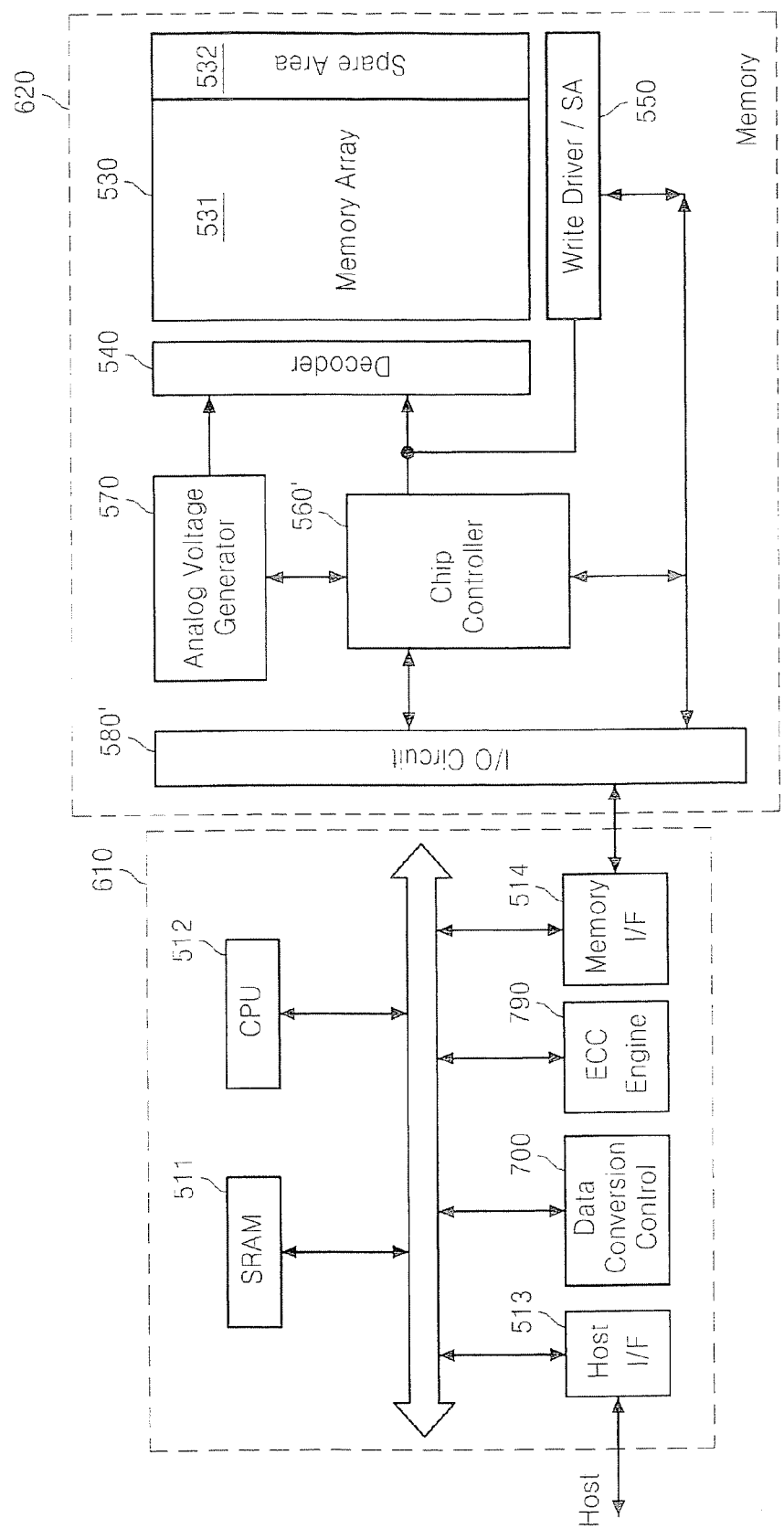
FIG. 6 is a block diagram of a non-volatile memory system according to other embodiments of the present inventive concept.

FIG. 6 is a block diagram of a non-volatile memory system 600 according to other embodiments of the present inventive concept. The non-volatile memory system 600 includes a non-volatile memory device 620 and a memory controller 610 controlling the non-volatile memory device 620. To avoid redundancy, only the operations and structure of the non-volatile memory system 600 different from those of the non-volatile memory system 500 will be described.

While the data conversion control block 700 and the ECC engine 790 are included within the chip controller 560 in the non-volatile memory device 520 of the non-volatile memory system 500 illustrated in FIG. 5, they are included in the memory controller 610 outside the non-volatile memory device 620 in the non-volatile memory system 600 illustrated in FIG. 6. Accordingly, a data set to be programmed to the non-volatile memory device 620 is subjected to state conversion and ECC encoding by the memory controller 610 and then transmitted and programmed to the non-volatile memory device 620. The non-volatile memory system 600 illustrated in FIG. 6 may be a memory card.

Figure 11:
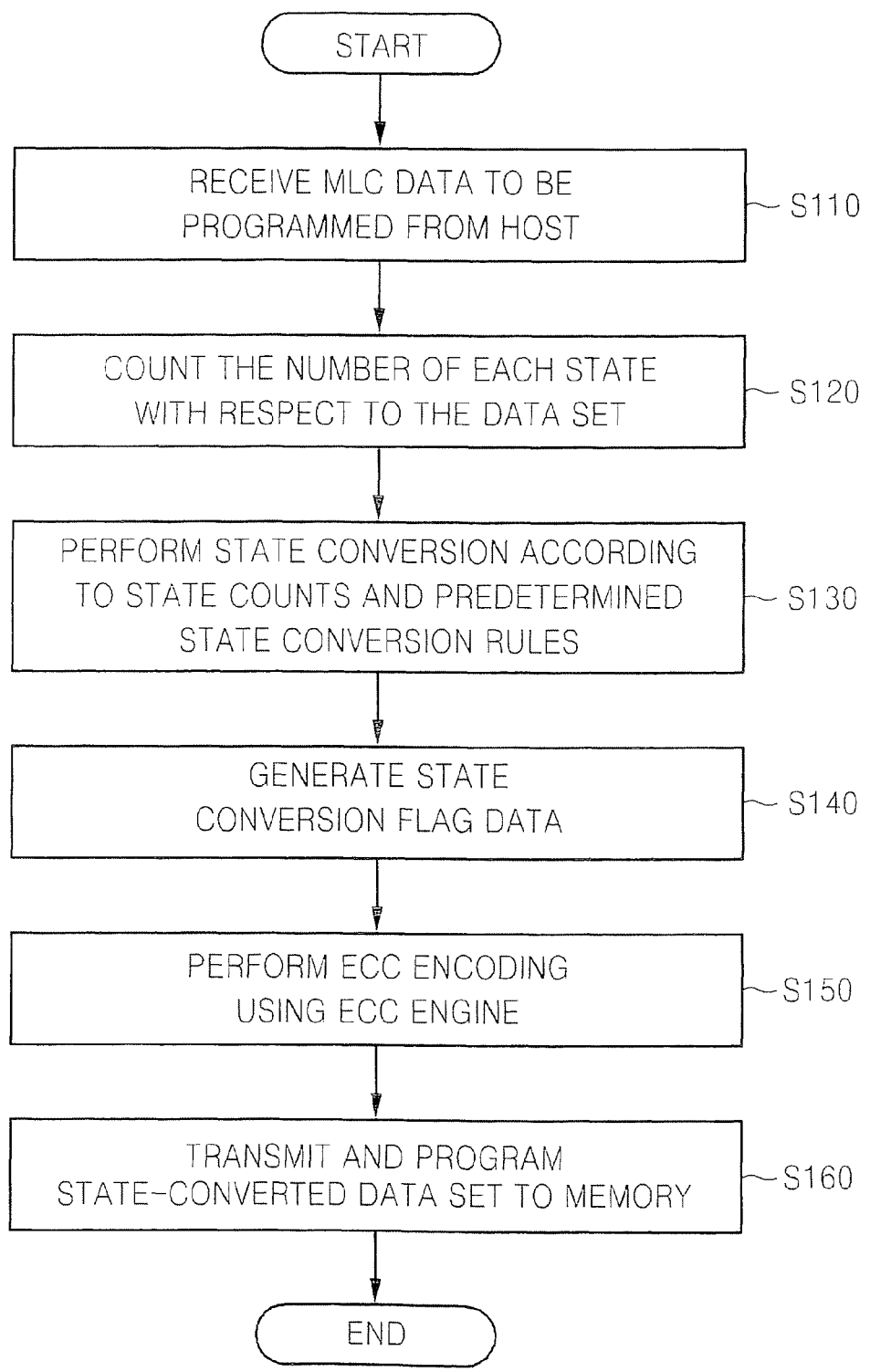
FIG. 11 is a flowchart of a method of programming data according to some embodiments of the present inventive concept.

FIG. 11 is a flowchart of a method of programming data according to some embodiments of the present inventive concept. An MLC data set, e.g., n-page user data, to be programmed is received from a host in operation S110. Here, "n" is 2 or an integer greater than 2. The number of cells in each state is counted with respect to the MLC data set in operation S120. At this time, as illustrated in FIG. 8, the MLC data set (i.e., page data) may be divided into a plurality (e.g., "n") of sectors and the number of cells in each state may be counted per sector. Alternatively, the number of cells in each state may be counted per page.

State conversion is performed according to state counts resulting from counting the number of cells in each state and predetermined state conversion rules in operation S130. State conversion flag data is generated according to a result of the state conversion in operation S140. The state conversion rules and the state conversion flag data have been described above and thus a detailed description thereof will be omitted. According to the embodiments of the present inventive concept illustrated in FIG. 8, the P3 state, i.e. "10" and the E state, i.e., "11" are swapped in the state conversion. Here, the state conversion flag data is 2 bits in length and is set to "01" when the P3 state of "10" and the E state of "11" are swapped, but the present inventive concept is not restricted to these embodiments.

Referring back to FIG. 11, the data set is ECC-encoded using an ECC engine to generate ECC information in operation S150. The data set including state-converted data, the state conversion flag data, and the ECC information is transmitted and programmed to a memory in operation S160. At this time, the state-converted data may be written to the main area 531 of the memory cell array 530 and the state conversion flag data and the ECC information may be written to the spare area 532 of the memory cell array 530. According to some embodiments of the present inventive concept, data actually programmed to the memory is the state-converted data.

Figure 12:
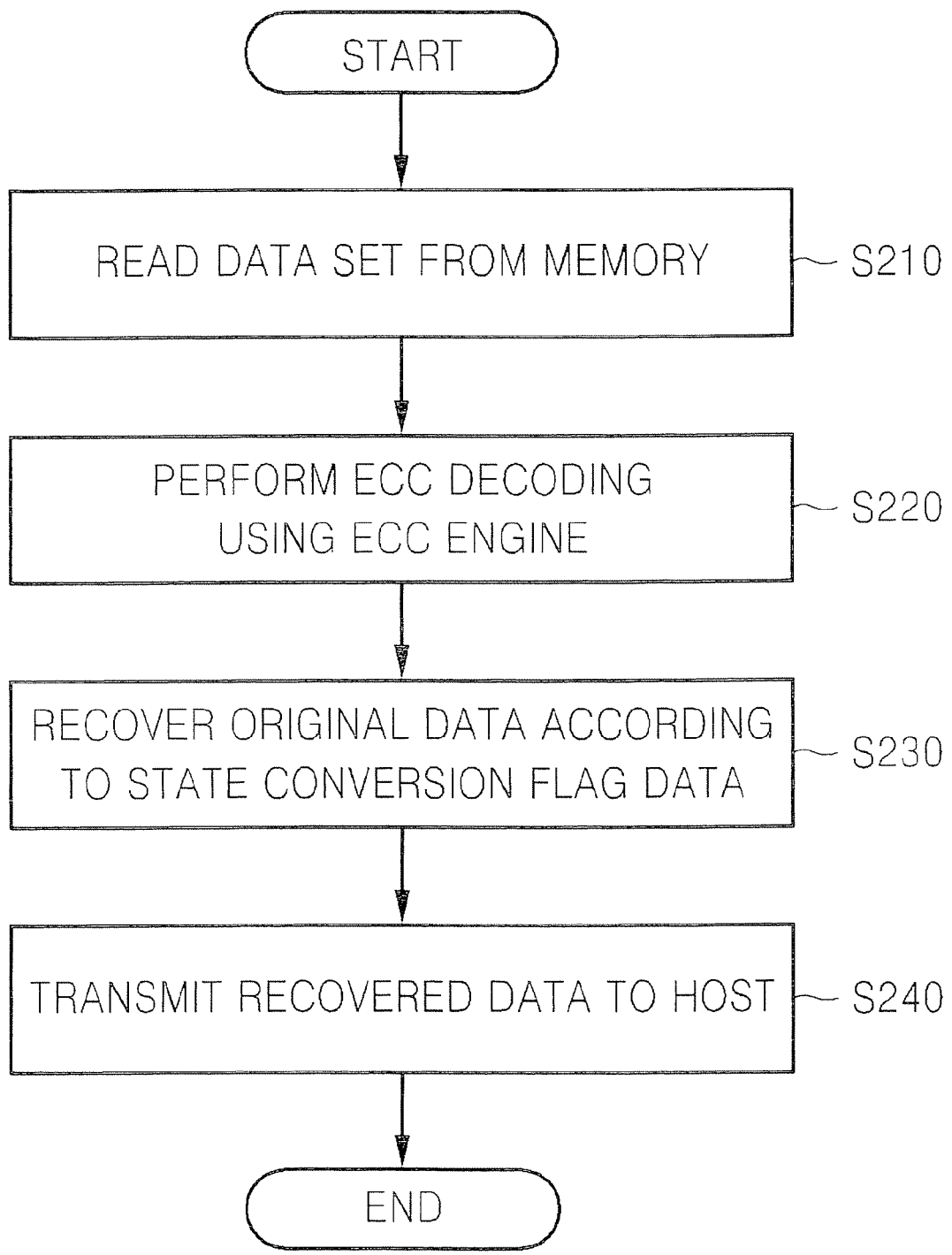
FIG. 12 is a flowchart of a method of reading data according to some embodiments of the present inventive concept.

FIG. 12 is a flowchart of a method of reading data according to some embodiments of the present inventive concept. A data set is read from a memory in operation S210. The data set includes state-converted data, state conversion flag data, and ECC information. ECC decoding is performed on the data set based on ECC information using an ECC engine to correct error bits in operation S220. States that have been converted in the state-converted data are reconverted according to the state conversion flag data to recover original data of the state-converted data in operation S230. The recovered data set is transmitted to a host in operation S240.

The ECC encoding is performed after the state conversion in the embodiments illustrated in FIG. 11 and the state recovery is performed after the ECC decoding in the embodiments illustrated in FIG. 12, but the order of operations is not restricted to these embodiments.

Figure 13A:
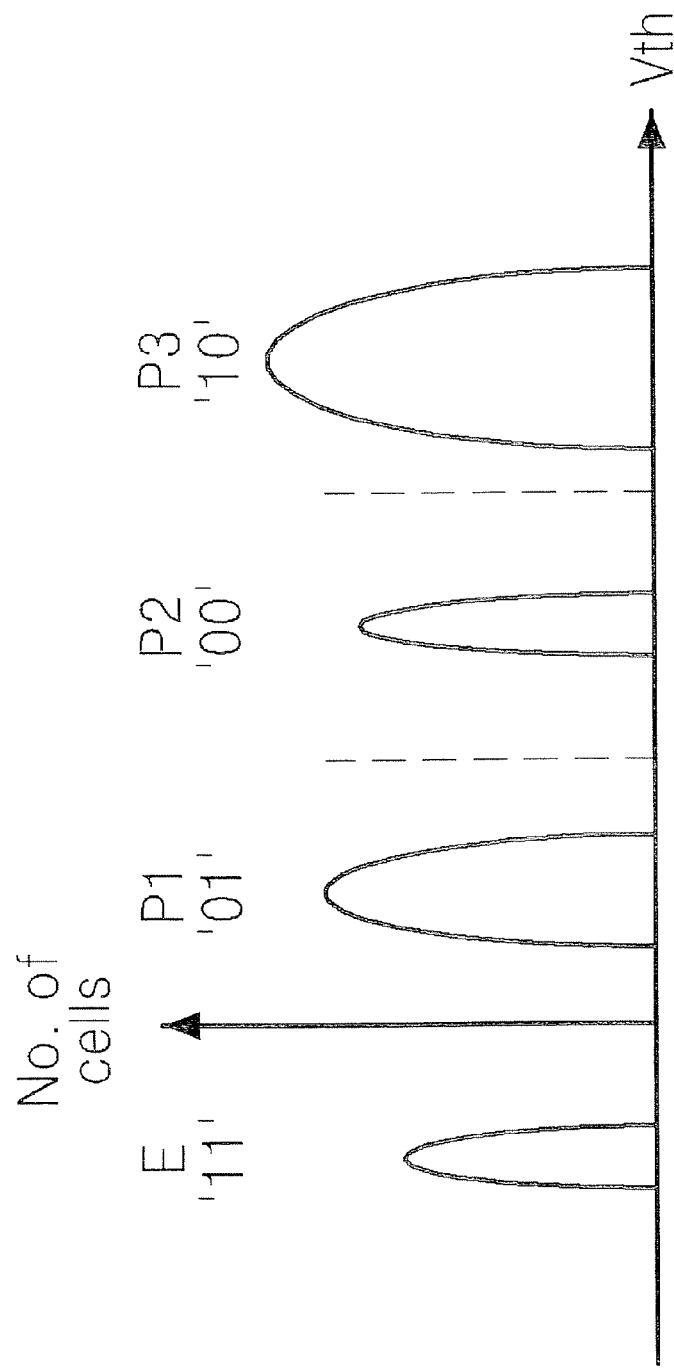
FIGS. 13A and 13B are graphs showing a cell distribution before state conversion and a cell distribution after state conversion according to some embodiments of the present inventive concept.
Figure 13B:
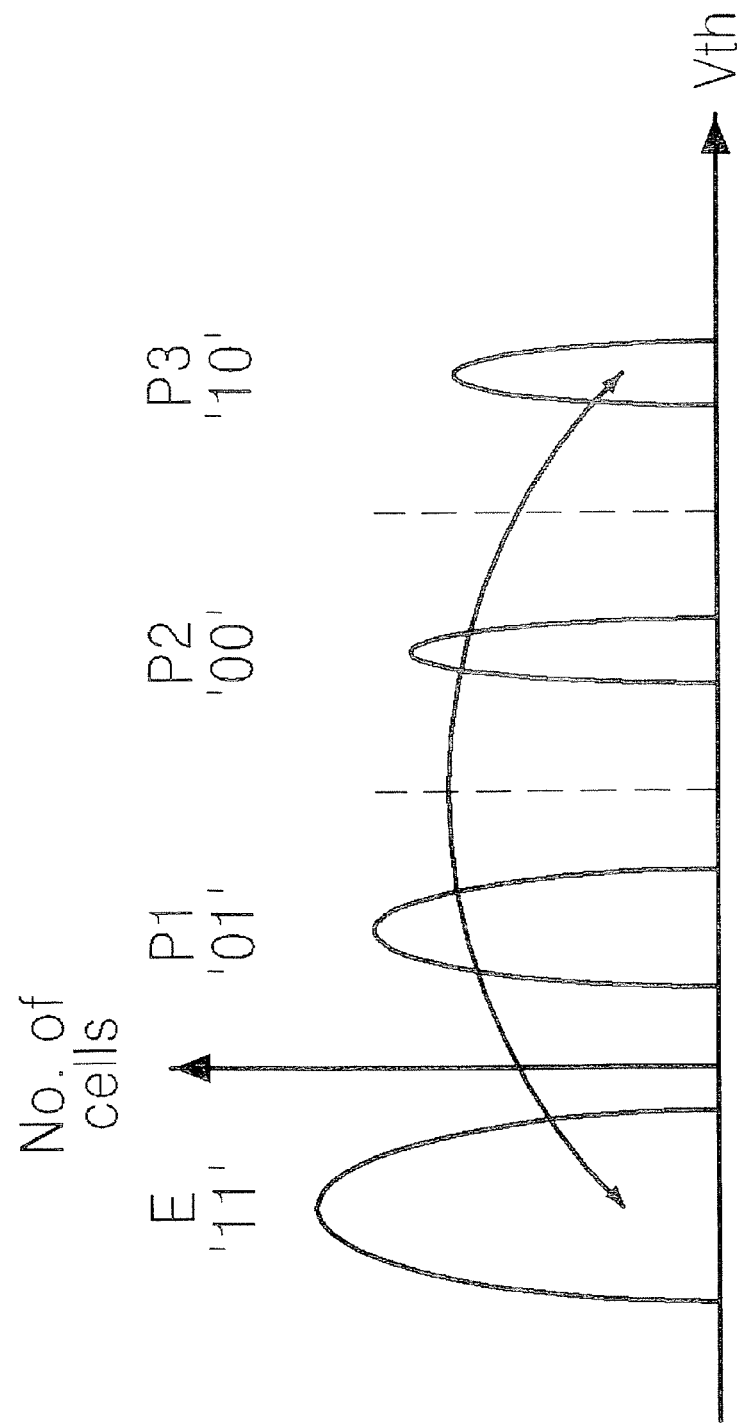

FIG. 13A is a graph showing a cell distribution before state conversion. Referring to FIG. 13A, the number of cells in the P3 state of "10" having the highest threshold voltage, i.e. a P3 state count is greater than any other state counts and the number of cells in the E state of "11", i.e. an E state count is less than any other state counts. FIG. 13B is a graph showing a cell distribution after state conversion according to some embodiments of the present inventive concept. Referring to FIG. 13B, the P3 state of "10" and the E state of "11" are swapped, so that the P3 state count is least and the E state count is greatest.

As described above, according to the current embodiments of the present inventive concept, state conversion is performed such that the number of cells in the P3 state having the highest threshold voltage is least, thereby reducing charge loss and coupling effect. As a result, the reliability of a non-volatile memory device is increased.

Figure 14A:
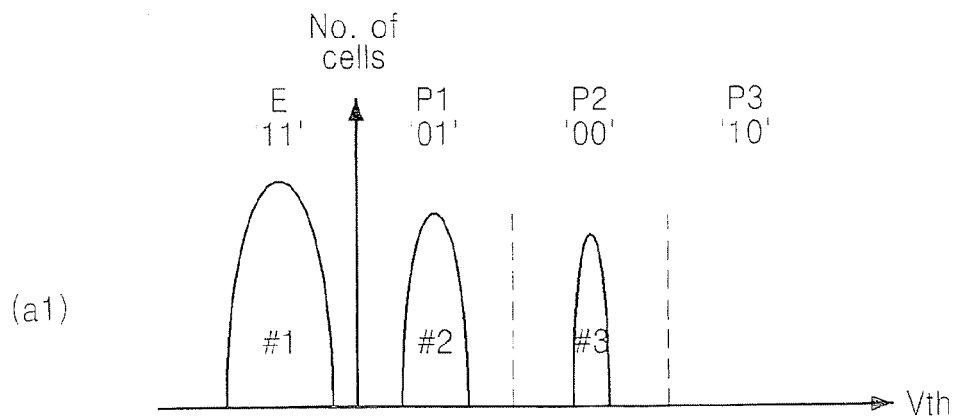
FIG. 14A illustrates graphs showing cell distributions before state conversion.
Figure 14A:
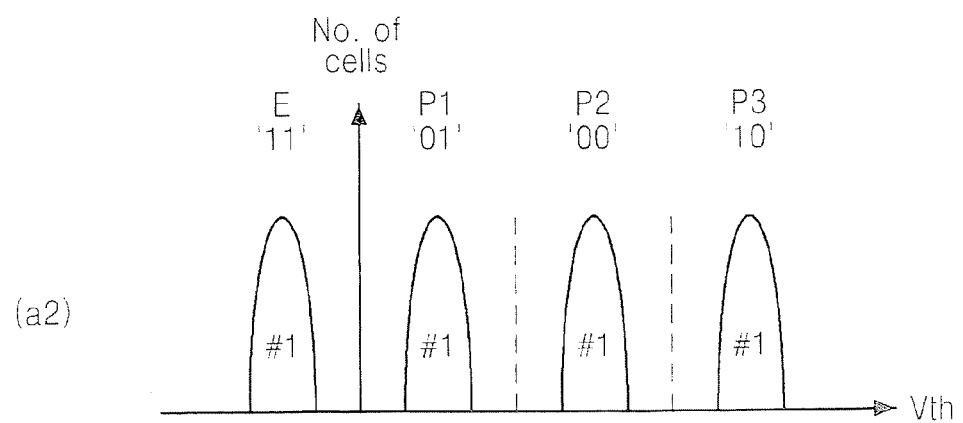
Figure 14A:
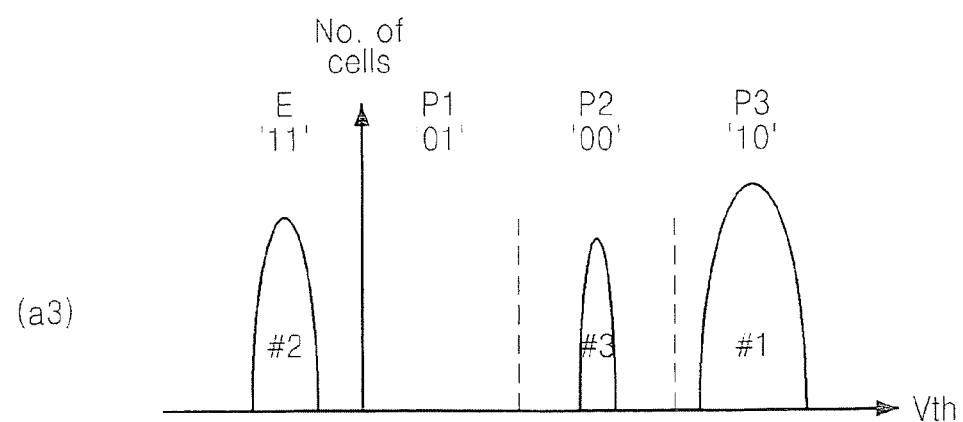
Figure 14B:
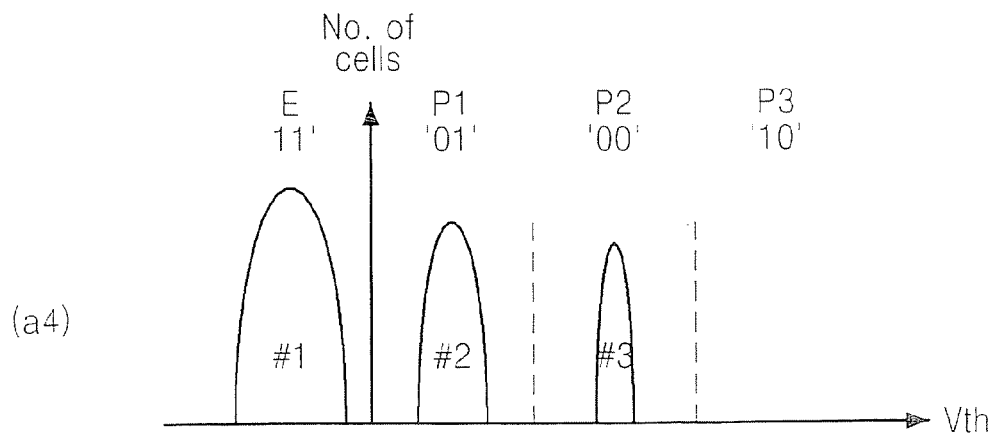
FIG. 14B illustrates graphs showing cell distributions after the state conversion in some embodiments of the present inventive concept.
Figure 14B:
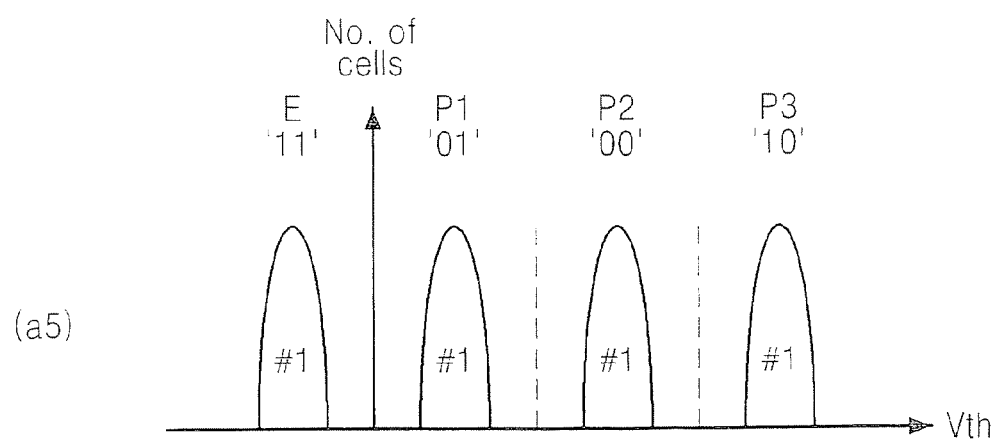
Figure 14B:
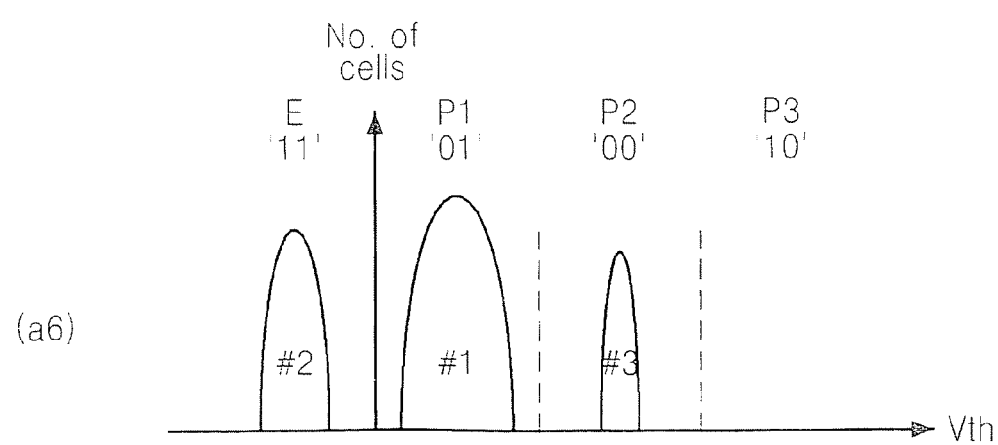

FIG. 14A illustrates graphs showing cell distributions before state conversion. FIG. 14B illustrates graphs showing cell distributions after state conversion in some embodiments of the present inventive concept. In FIG. 14A, graph (a1) shows a cell distribution when the P3 state count is less than any other state counts; graph (a2) shows a cell distribution when the P3 state count is similar to the other state counts; and graph (a3) shows a cell distribution when the P3 state count is greater than any other state counts. When a state conversion programming method according to some embodiments of the present inventive concept is used in cases corresponding to graphs (a1) through (a3), the cell distributions shown in graphs (a1) through (a3) may be changed into graphs (a4), (a5), and (a6), respectively, illustrated in FIG. 14B. In other words, state conversion is not performed in the cases corresponding to graphs (a1) and (a2). In the case corresponding to graph (a3), the P3 state of "10" that has the highest threshold voltage and the greatest state count is swapped for the P1 state of "01" that has a lower threshold voltage than the P3 state and the least state count, so that the P3 state count is least.

Accordingly, when the state conversion programming method according to some embodiments of the present inventive concept is used, the worst case is the case corresponding to graph (a5) illustrated in FIG. 14B, in which the P3 state count is similar to the other state counts. Except this case, the P3 state count may be always less than an average state count or any other state counts. As a result, the reliability of a non-volatile memory device can be increased.

In the above-described embodiments of the present inventive concept, a state of a memory cell is defined based on the threshold voltage of the memory cell, i.e., a cell transistor. However, the present inventive concept is not restricted to these embodiments. For instance, the state of the memory cell may be defined based on a current or a resistance. In detail, the current or resistance of the memory cell may vary with the storage state of data stored in the memory cell, i.e., a cell state. In this case, a cell distribution may be represented by the numbers of cells in different currents or resistances.

The non-volatile memory device 520 or 620 and/or the memory controller 510 or 610 according to some embodiments of the present inventive concept may be packed in various types of packages. For example, the various packages may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

The memory device 520 or 620 and the memory controller 510 or 610 may form a memory card. At this time, the memory controller 510 or 610 may be designed to communicate with an external device, e.g., a host, using one of various interface protocols such as universal serial bus (USB), multi-media card (MMC), a peripheral component interconnect express (PCI-E), serial ATA (SATA), parallel ATA (PATA), small computer system interface (SCSI), enhanced small disk interface (ESDI), and integrated drive electronics (IDE).

With the increase of use of mobile devices such as cellular phones, personal digital assistant (PDA) digital cameras, portable game consoles, and MP3 players, the memory devices 520 and 620 can be used as code storages as well as data storages. The memory devices 520 and 620 can also be used in home applications such as high definition televisions (HDTVs), DVDs, routers, and global positioning systems (GPSs).

Figure 15:
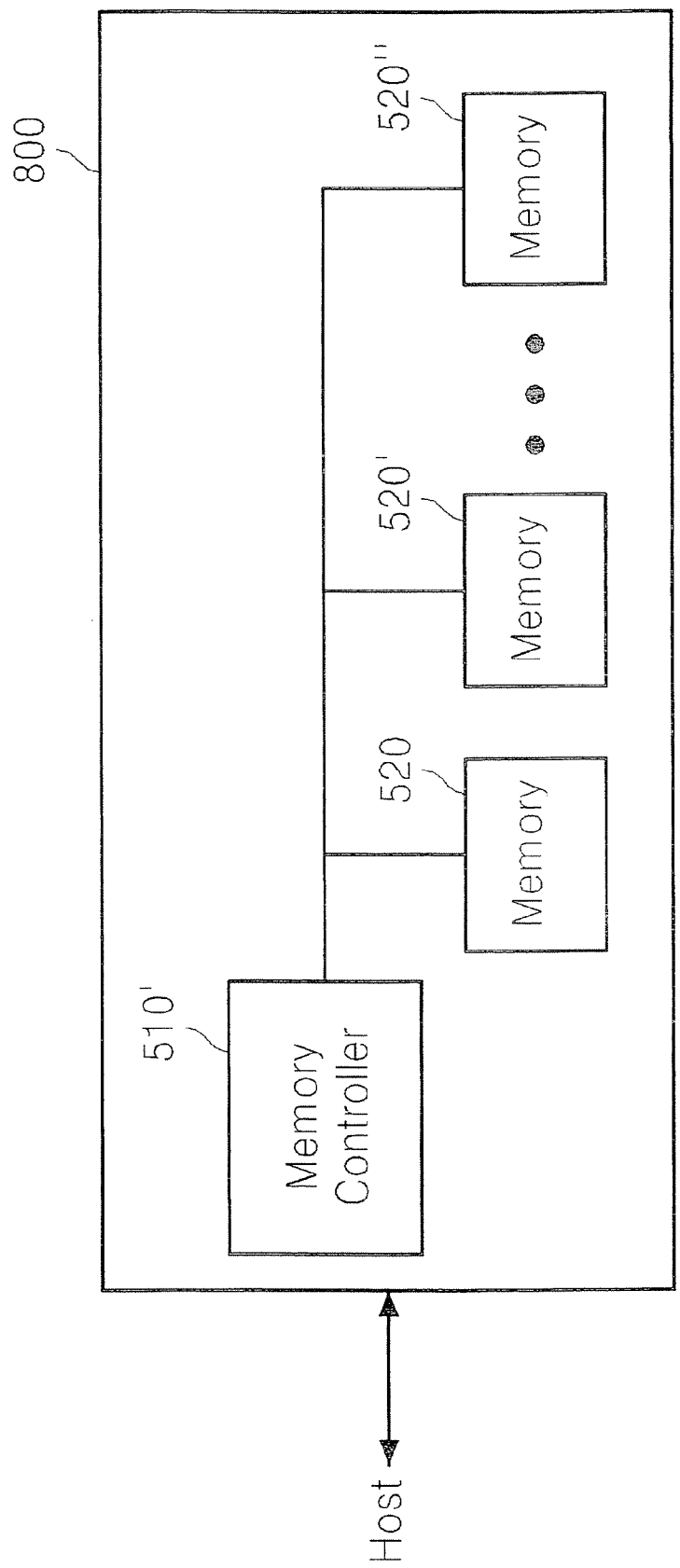
FIG. 15 is a schematic block diagram of a non-volatile memory system according to other embodiments of the present inventive concept.

The embodiments illustrated in FIG. 5 or 6 show the memory system 500 or 600 in which the memory controller 510 or 610 controls the single non-volatile memory device 520 or 620. According to other embodiments of the present inventive concept, a memory system 800 may include a plurality of memory devices 520, 520', and 520" as illustrated in FIG. 15. In other words, the memory system 800 may include a plurality of the memory devices 520, 520', and 520" and a memory controller 510' controlling the memory devices 520 through 520". The memory system 800 illustrated in FIG. 15 may be memory card.

The memory system 800 may include the data conversion control block 700 in each of the memory devices 520 through 520" like the memory system 500 illustrated in FIG. 5 or may include the data conversion control block 700 in the memory controller 510' like the memory system 600 illustrated in FIG. 6.

The non-volatile memory device or the memory system according to an exemplary embodiment of the present inventive concept may be embedded in the electronic system such as mobile devices, laptop computers, or desktop computers. Some examples of the electronic system are illustrated in FIGS. 16 and 17.

Figure 16:
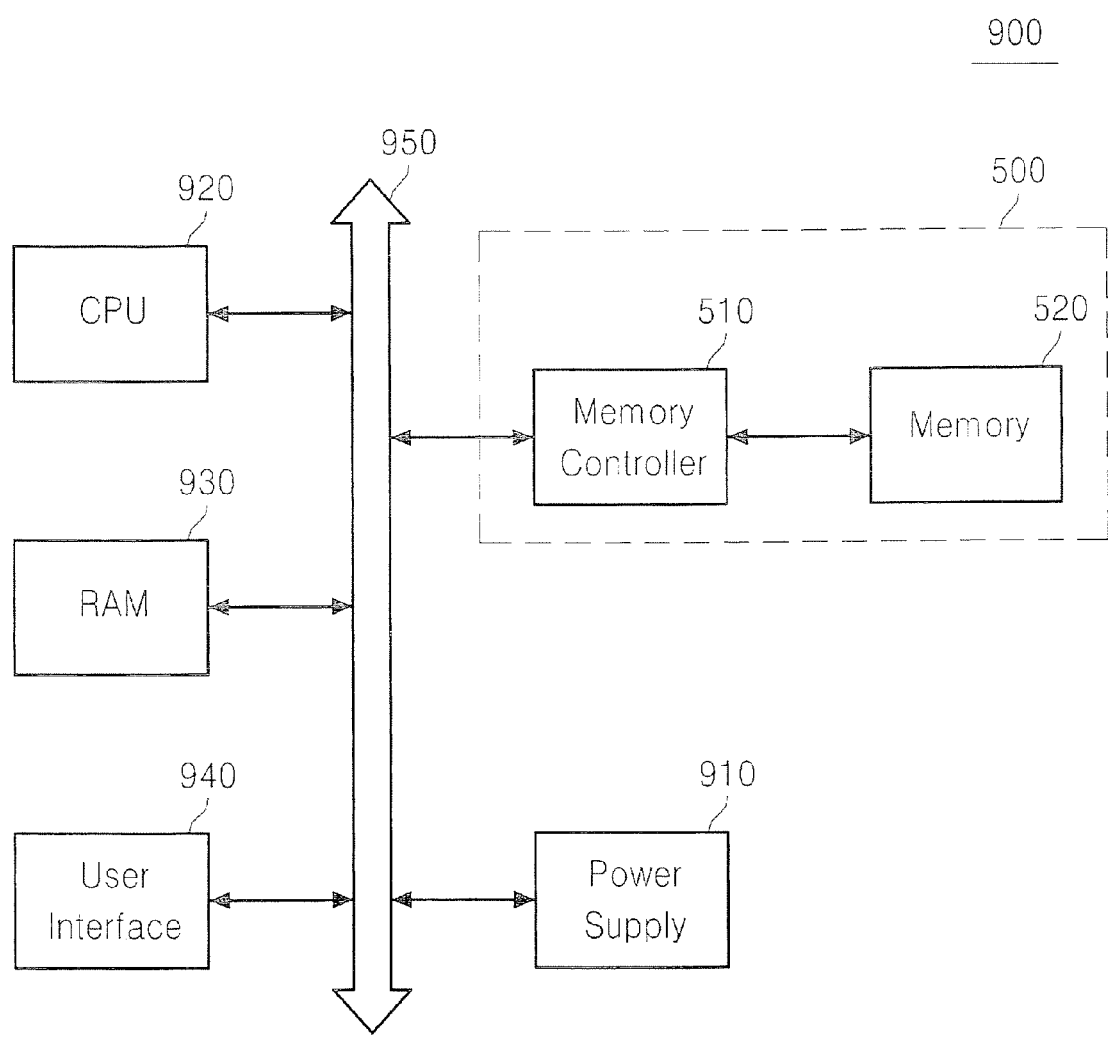
FIGS. 16 and 17 are a block diagram of an electronic system according to an exemplary embodiment of the present inventive concept, respectively.
Figure 17:
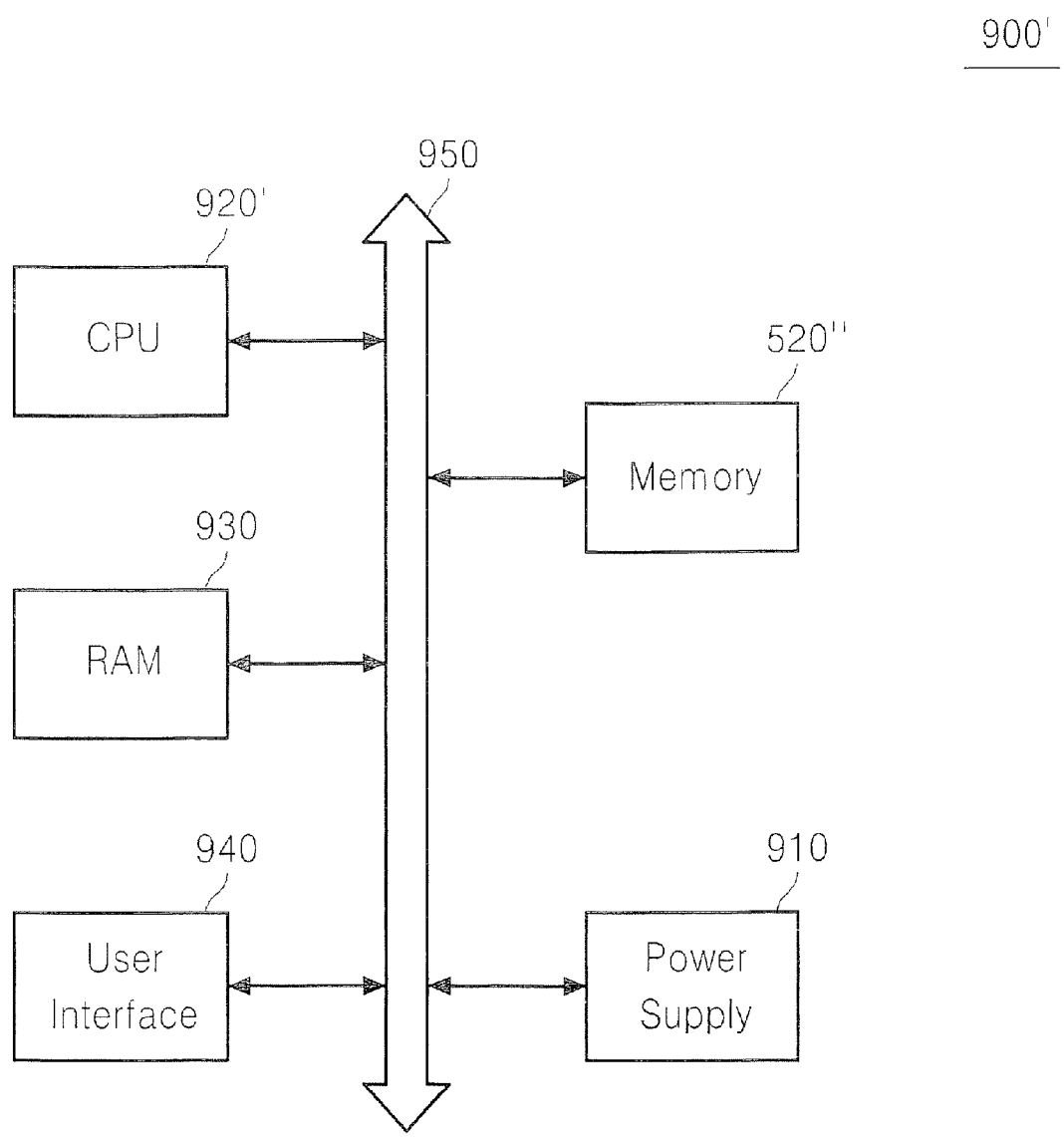

Referring to FIG. 16, the electronic system 900 according to the present exemplary embodiment may include a nonvolatile memory system 500, a power supply 910, a central processing unit (CPU) 920, a RAM 930, a user interface 940, and a system bus 950 electrically connecting these elements.

The CPU 920 controls the overall operation of the electronic system 900. The RAM 930 stores information needed for the operation of the electronic system 900. The user interface 940 provides an interface between the electronic system 900 and a user. The power supply 910 supplies electric power to the internal constituent elements such as the CPU 920, the RAM 930, the user interface 940, and the nonvolatile memory system 500.

The flash memory 520 stores the N-bit data, where N is 1 or an integer greater than 1, that is provided through the user interface 940 or processed or will be processed by the CPU 920, via the memory controller 200.

The memory system 500 according to an exemplary embodiment of the present inventive concept is as described above. A detailed description thereof will be thus omitted. The electronic system 900 may embed the memory system 600 in FIG. 5 or the memory system 800 in FIG. 15 instead of the memory system 500.

Although the memory device 520 or 620 and the memory controller 510 or 610 may together constitute a single memory card, the memory device 520 or 620 and the memory controller 510 or 610 may be separately embodied. The memory controller and the flash memory may constitute, for example, a solid state drive/disk (SSD) using a non-volatile memory for storing data. The memory controller 510 or 610 may be embodied in a host.

FIG. 17 illustrates an electronic system 900' according to an exemplary embodiment of the present inventive concept. In the embodiment illustrated in FIG. 17, a nonvolatile memory device 520''' may functions as main memory of the electronic system 900'. The CPU 920' controls the overall operation of the electronic system 900' and functions as memory controller. For example, the CPU 920' may receive and process data input via the user interface 940 and then transmit the data to the nonvolatile memory device 520' via the system bus 950. The nonvolatile memory device 520∝'' may store the data input via the system bus 950 into memory cells. The data stored in memory cells are read by the CPU 920' and output via the user interface 940.

Although the nonvolatile memory device 520''' has similar construction and function as the nonvolatile memory device 520 illustrated in FIG. 5, the nonvolatile memory device 520''' does not interface with the host via a memory controller but directly interfaces with the host.

A state conversion function according to an exemplary embodiment of the present inventive concept may be embodied in the CPU 920' of a host, instead of the nonvolatile memory device 520'''. The electronic system 900' illustrated in FIG. 17 may be portable electronic system such as mobile device.

Although it is not illustrated in the drawings, the electronic system 900 or 900' may be further provided with application chipsets, camera image processors (CISs), or mobile DRAMs, which is well known to one skilled in the art to which the present inventive concept pertains.

The non-volatile memory operation method according to some embodiments of the present inventive concept can also be embodied in hardware, software, firmware or combination thereof. When the method is embodied in software, it can be embodied as computer readable codes or programs on a computer readable recording medium. The computer readable recording medium is any data storage device that can store data which can be thereafter read by a computer system. Examples of the computer readable recording medium may includes read-only memory (ROM), random-access memory (RAM), electrically erasable programmable ROM (EEPROM), and flash memory.

According to some embodiments of the present inventive concept, state conversion is performed to decrease the number of cells in a state causing a largest amount of charge loss or coupling effect before cells are programmed in a nonvolatile memory device, thereby reducing the charge loss and the coupling effect. As a result, the reliability of the nonvolatile memory device and a system including the same can be increased.

While the present inventive concept has been particularly shown and described with reference to exemplary embodiments thereof, it will be understood by those of ordinary skill in the art that various changes in forms and details may be made therein without departing from the spirit and scope of the present inventive concept as defined by the following claims.

What is claimed is:

1. A method of programming a nonvolatile memory device having multi-state memory cells therein, comprising:
programming a plurality of nonvolatile memory cells in the non-volatile memory device with state-converted data derived from non-state-converted data such that a state associated with a highest threshold voltage among the plurality of states is swapped for a state associated with a lowest state count among the plurality of states, in response to a state conversion rule to swap the state associated with the highest threshold voltage for the state associated with the lowest state count;
generating a flag having a value that indicates which ones of the plurality of states is swapped with other ones of the plurality of states in the state-converted data; and
decoding the state-converted data into the non-state-converted data, based on the value of the flag.

2. The method of claim 1, wherein the state-converted data is associated with a greater number of erased states relative to the non-state-converted data when programmed into the plurality of nonvolatile memory cells.

3. The method of claim 1, wherein the plurality of nonvolatile memory cells are m-bit memory cells configured to support $2^m$ distinct threshold voltage states per cell; and wherein said programming comprises encoding the non-state-converted data into state-converted data using an encoding algorithm configured to reduce a number of the plurality of nonvolatile memory cells programmed with a maximum of the $2^m$ distinct threshold voltage states when the plurality of nonvolatile memory cells are programmed with state-converted data relative to when the plurality of nonvolatile memory cells are programmed with non-state-converted data.

4. A method of operating a non-volatile memory device including a plurality of multi-level memory cells, the method comprising:
counting the number of multi-level memory cells in each of a plurality of states with respect to a data set and generating each state count;
generating a state-converted data set by swapping at least one state among the plurality of states for one state among the rest of the states according to state count for the respective state and a predetermined state conversion rule;
generating state conversion flag data indicating information about the swapped states; and
programming the state-converted data set to cells selected from among the plurality of multi-level memory cells,
wherein the plurality of states are associated with one factor among a threshold voltage, a current, and a resistance of each of the multi-level memory cells,
wherein generating the state-converted data set comprises swapping a state having a highest value of the factor among the plurality of states for one of the plurality of states having a lower value of the factor among the plurality of states, in response to the predetermined state conversion rule comprising a state conversion rule to swap the state having the highest value of the factor for a state associated with a lowest state count among the plurality of states, and
wherein with respect to the state-converted data set, a state count for the state having the highest value of the factor among the plurality of states is less than state counts for any other states among the plurality of states.

5. The method of claim 4, further comprising receiving the data set from a host.

6. The method of claim 4, further comprising:
reading the state-converted data set from the cells selected from among the plurality of multi-level memory cells;
recovering the data set from the state-converted data set by re-swapping the states that have been swapped before according to the state conversion flag data; and
transmitting the recovered data set to the host.

7. The method of claim 4, wherein the state-converted data set is stored in a user data area of a memory cell array including the plurality of multi-level memory cells, and the state conversion flag data is stored in a spare area of the memory cell array.

8. The method of claim 4, wherein the state conversion rule comprises at least two stage rules to which a priority order is given, and the state conversion flag data comprises flag data indicating information about states converted according to each of the at least two stage rules.

9. The method of claim 4, wherein the state conversion rule comprises a rule for converting the states such that the state counts for the respective states increase in predetermined order of the states.

10. The method of claim 4, further comprising refraining from generating the state-converted data set when the state having the highest value of the factor has a lower state count than every other one of the plurality of states.

11. A non-volatile memory device comprising:
a memory cell array comprising a plurality of non-volatile multi-level memory cells;
a data conversion control block configured to count the number of multi-level memory cells in each of a plurality of states with respect to a multi-level data set to generate each state count, generate a state-converted data set by swapping a state associated with a highest threshold voltage among the plurality of states for a state associated with a lowest state count among the plurality of states, in response to a state conversion rule to swap the state associated with the highest threshold voltage for the state associated with the lowest state count, and generate state conversion flag data indicating information about the swapped states; and
a write driver/sense amplifier circuit configured to write the state-converted data set to cells selected from the memory cell array and read the state-converted data set from the selected cells.

12. The non-volatile memory device of claim 11, wherein the data conversion control block recovers the data set from the state-converted data set read by the write driver/sense amplifier circuit by re-swapping the states that have previously been swapped according to the state conversion flag data.

13. The non-volatile memory device of claim 12, further comprising an error correction code (ECC) engine configured to ECC-encode the state-converted data set, or to ECC-encode the data set before the state conversion, and to ECC-decode the data set recovered from the state-converted data set, or to ECC-decode the state-converted data set before the recovery.

14. The non-volatile memory device of claim 11, wherein the memory cell array is divided into a user data area and a spare area, the state-converted data set is stored in the user data area, and the state conversion flag data is stored in the spare area.

15. A system comprising:
the non-volatile memory device of claim 11; and
a memory controller configured to control the non-volatile memory device.

16. A memory controller for controlling a non-volatile memory device including a plurality of non-volatile multi-level memory cells, the memory controller comprising:
a data conversion control block configured to count the number of multi-level memory cells in each of a plurality of states with respect to a multi-level data set received from a host to generate each state count, generate a state-converted data set by swapping a state associated with a highest threshold voltage among the plurality of states for a state associated with a lowest state count among the plurality of states, in response to a state conversion rule to swap the state associated with the highest threshold voltage for the state associated with the lowest state count, and generate state conversion flag data indicating information about the swapped states; and a central processing unit configured to control the non-volatile memory device to write the state-converted data set to the non-volatile memory device and to read the state-converted data set from the non-volatile memory device.

17. The memory controller of claim 16, wherein the data conversion control block recovers the data set from the state-converted data set read from the non-volatile memory device by re-swapping the states that have previously been swapped according to the state conversion flag data.

18. The memory controller of claim 17, further comprising an error correction code (ECC) engine configured to ECC-encode the state-converted data set, or to ECC-encode the data set before the state conversion, and to ECC-decode the data set recovered from the state-converted data set, or to ECC-decode the state-converted data set which has been read from the non-volatile memory device.

* * * * *